United States Patent
Fanous et al.

(10) Patent No.: US 8,320,864 B2
(45) Date of Patent: *Nov. 27, 2012

(54) METHOD AND SYSTEM FOR MULTIPLE TUNER APPLICATION USING A LOW NOISE BROADBAND DISTRIBUTION AMPLIFIER

(75) Inventors: Adel Fanous, Irvine, CA (US); Leonard Dauphinee, Irvine, CA (US); Lawrence M. Burns, Laguna Hills, CA (US); Donald McMullin, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 646 days.

This patent is subject to a terminal disclaimer.

(21) Appl. No.: 12/503,232

(22) Filed: Jul. 15, 2009

(65) Prior Publication Data
US 2009/0273401 A1 Nov. 5, 2009

Related U.S. Application Data

(62) Division of application No. 10/214,097, filed on Aug. 8, 2002, now Pat. No. 7,579,912.

(60) Provisional application No. 60/312,086, filed on Aug. 15, 2001, provisional application No. 60/363,545, filed on Mar. 13, 2002.

(51) Int. Cl.
H04B 1/06 (2006.01)
H04B 7/00 (2006.01)
H04B 1/16 (2006.01)

(52) U.S. Cl. ............... 455/232.1; 455/241.1; 455/246.1; 455/253.2; 455/341; 330/124 R; 330/278; 330/295

(58) Field of Classification Search .................. 455/132, 455/136, 138, 189, 232.1, 234.1–234.2, 239.1, 455/240.1, 245.1–251.1, 241.1, 253.2, 341; 375/345; 330/124 R, 278, 295
See application file for complete search history.

(56) References Cited

U.S. PATENT DOCUMENTS

| 5,179,730 A | * | 1/1993 | Loper ............................ 455/266 |
| 5,745,846 A | * | 4/1998 | Myer et al. ..................... 455/209 |
| 6,091,441 A | | 7/2000 | Al-Araji et al. |

(Continued)

OTHER PUBLICATIONS

International Search Report issued Oct. 3, 2002, for Application No. PCT/US02/25804, 4 pages.

*Primary Examiner* — Simon Nguyen
(74) *Attorney, Agent, or Firm* — Sterne, Kessler, Goldstein & Fox P.L.L.C.

(57) ABSTRACT

An active splitter circuit arrangement includes a first amplification module having a number of first input ports and first output ports. The first amplification module is configured to provide first stage amplification to a received input signal and produce from the amplified input signal a number of output signals, each substantially matching the input signal. Also included is a first gain control device having a number of gain input ports respectively coupled to the first output ports and a gain output port coupled to at least one of the first input ports. The first gain control device is configured to control a gain of the first amplification module. Next, a number of second amplification modules corresponding to the number of output signals has a number of second input ports respectively coupled to the first output ports. Each second amplification module is configured to receive a control signal from the second gain control device, provide second stage amplification to a corresponding one of the number of output signals based upon the control signal and produce an amplified output signal.

16 Claims, 23 Drawing Sheets

U.S. PATENT DOCUMENTS

| | | |
|---|---|---|
| 6,188,284 B1 | 2/2001 | Shulman |
| 6,397,051 B1 | 5/2002 | Abbasi et al. |
| 6,670,848 B2 * | 12/2003 | Fanous et al. ............. 330/124 R |
| 6,670,901 B2 * | 12/2003 | Brueske et al. ............... 341/139 |
| 6,694,129 B2 * | 2/2004 | Peterzell et al. ................. 455/76 |
| 6,838,937 B2 * | 1/2005 | Fanous et al. ............. 330/124 R |
| 7,065,327 B1 * | 6/2006 | Macnally et al. ............... 455/78 |

* cited by examiner

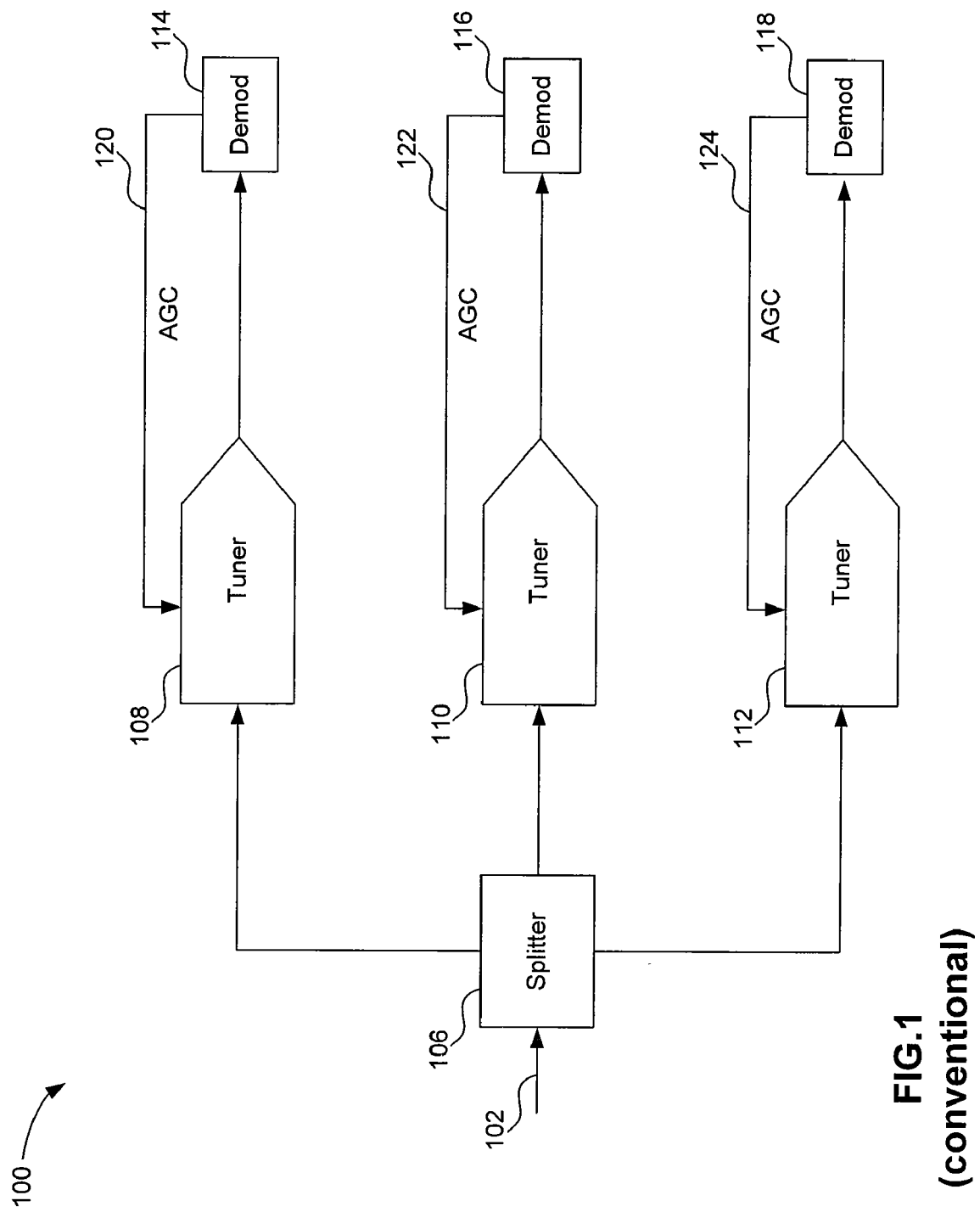
FIG.1
(conventional)

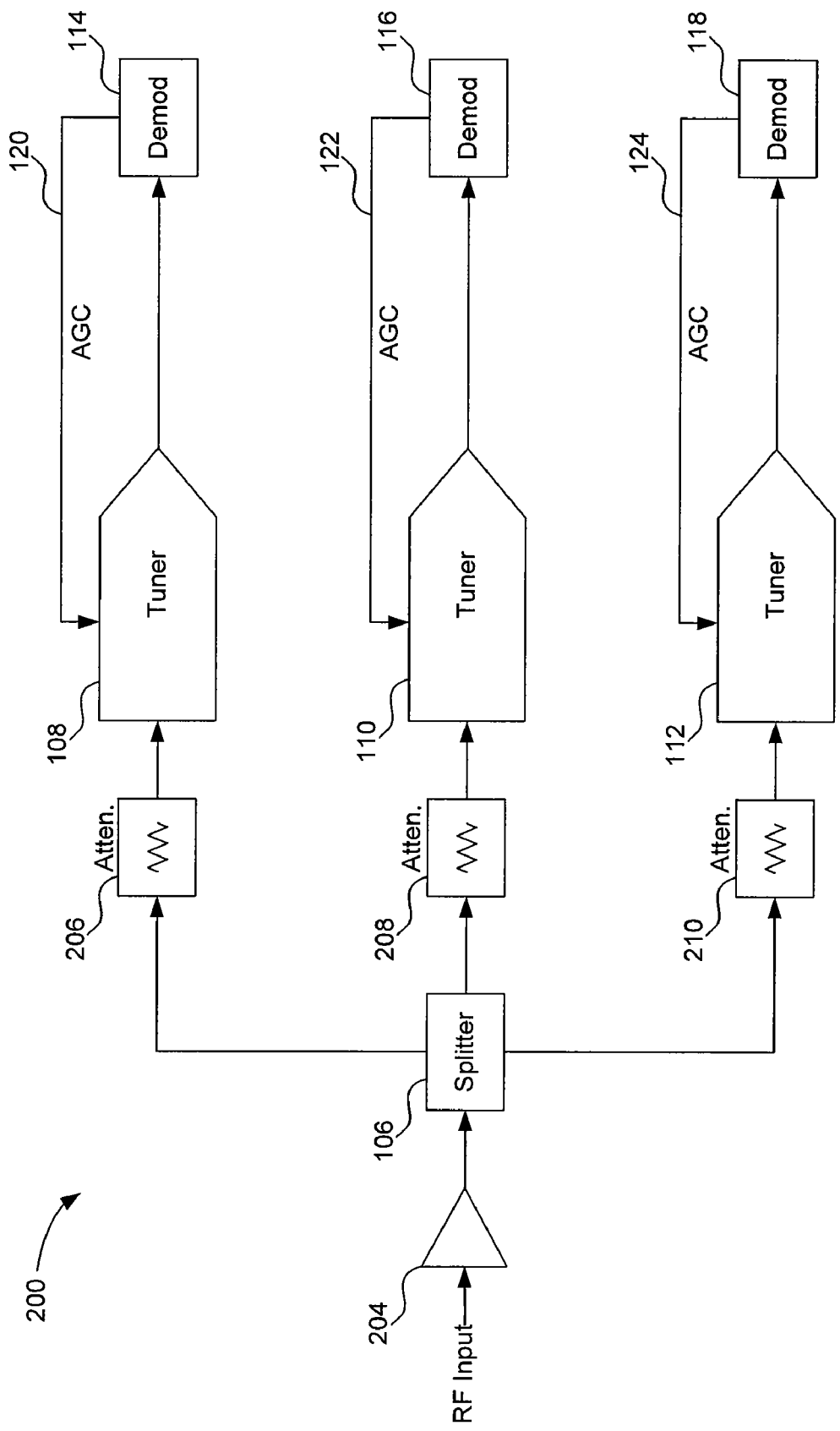
FIG. 2
(conventional)

METHOD AND SYSTEM FOR MULTIPLE TUNER APPLICATION USING A LOW NOISE BROADBAND DISTRIBUTION AMPLIFIER

CROSS-REFERENCE TO RELATED APPLICATIONS

This application is a divisional of U.S. Non-Provisional application Ser. No. 10/214,097 filed Aug. 8, 2002, now allowed. U.S. Non-Provisional application Ser. No. 10/214,097 claims the benefit of U.S. Provisional Application No. 60/312,086 filed Aug. 15, 2001, and U.S. Provisional Application No. 60/363,545, filed Mar. 13, 2002. U.S. Non-Provisional application Ser. No. 10/214,097, U.S. Provisional Application No. 60/312,086, and U.S. Provisional Application No. 60/363,545 are incorporated herein by reference.

BACKGROUND OF THE INVENTION

1. Field of the Invention

The present invention relates generally to the field of low noise amplifiers (LNAs) used in tuners. More specifically, the present invention relates to LNAs used in the tuners of set-top boxes, cable modems, and high definition television (HDTV) devices. Tuners of this type can also be used in personal video recorders (PVRs), out-of-band (OOB) devices, analog TV, and voice over internet protocol (VOIP) devices, as well as numerous other applications.

2. Related Art

Due to the complexity and availability of entertainment program source material, multiple television tuners are included in most set-top cable boxes and cable modems. These additional features, material, and functionality cause the set-top boxes to be significantly more complex and include increased functionality. Examples of this increased functionality include the ability to watch simultaneous channels, such as the popular picture-in-picture (PIP) television viewing mode and/or the ability to watch one channel while simultaneously recording another channel using a video cassette or a personal video recorder (PVR). In traditional cable-set boxes, passive splitters with sufficient bandwidth are used to split the incoming cable signal into multiple outputs in order to drive multiple tuners to provide PIP or facilitate the viewing of one channel and the simultaneous recording of another. Unfortunately, however, the use of the passive splitters degrades the overall performance of the tuner.

For example, passive splitters are known to create insertion losses of about 6 dB, which significantly degrades the performance of the associated tuners. This level of degradation, in turn, impacts the overall system's noise figure and signal-to-noise ratio (SNR). An additional drawback of passive splitters in cable set-top boxes is that they do not permit the full use of cable signal ranges. Finally, passive splitters require extensive printed circuit board area and necessitate bulky metal configurations for electromagnetic shielding in order to minimize interference.

What is needed, therefore, is an alternative to the passive splitters currently used in cable television tuners or cable modem type applications. More specifically, what is needed is a tuner implementation that can improve upon the performance of passive splitters, such that splitting the input signal into multiple signals will not significantly degrade the overall performance of the tuner. This improved approach must facilitate the full use of the associated cable signal ranges. The improved approach must also reduce space requirements, reduce cost, and ease many of the manufacturing issues surrounding production of conventional tuners used in the aforementioned applications.

What is needed is a technique to provide autonomous automatic gain control (AGC) within the amplification modules associated with cable tuning and similar systems. Additionally, what is needed is an improved tuner with autonomous AGC that can be integrated onto a single integrated circuit (IC) and be implemented, for example, in complimentary metal-oxide semiconductor (CMOS) technology.

SUMMARY OF THE INVENTION

Consistent with the principles of the present invention as embodied and broadly described herein, an exemplary tuner system includes a signal splitting mechanism configured to receive and amplify a first input signal. The signal splitting mechanism also is configured to produce from the amplified first signal a number of second signals, each of the second signals being substantially identical to the amplified first signal. Finally, the signal splitting mechanism is configured to output each of the amplified second signals. Next, the exemplary system includes a number of tuners corresponding to the number of second signals. Each tuner includes a signal amplification function and is configured to receive one of the second signals output from the signal splitting mechanism and derive one or more informational signals therefrom.

The present invention also includes an exemplary method for processing a signal in an amplifier including a first amplification module, a number of second amplification modules, and a gain control device. The method comprises receiving a transmitted signal in the first amplification module and applying a first level of amplification thereto. Next, the method includes providing the first level amplified signal to each of the number of second amplification modules to produce a number of second level amplified signals. Each of the number of second level amplified signals has characteristics substantially similar to the other of the number of second level amplified signals. The method also includes detecting a signal level of each of the number of second level amplified signals and producing a gain control signal based upon the detected signal level. Finally, the method includes providing the gain control signal as an input to each of the amplifiers of the second amplification module and controlling a gain of the second amplification module based upon the provided gain control signal.

Features and advantages of the present invention include the integration of an active splitter tuner arrangement onto a single IC, having a relatively small physical size and footprint, in order to drive multiple tuners. This particular technique is also effective to improve second and third order distortion product performance by using a differential circuit topology. The technique of the present invention also provides AGC for associated amplification modules by providing the gain control function integrated with the amplification module. Finally, the present invention facilitates full use of the cable signal range with little or no noise figure penalty while also reducing space requirements, reducing costs, and easing the manufacturability cable set-top boxes.

Other features and advantages of the present invention include completely autonomous local AGC of variable gain type amplifiers which facilitates maximizing the output SNR plus distortion ratio of the associated tuners. An independent AGC function is included for each output to cover both positive and negative cable roll-off. Current steering circuits are used in second stage amplification modules to switch in or switch out gain smoothly with minimum impact on linearity.

Techniques in accordance with the present invention also facilitate providing signals proportional to amplifier gains and are scalable to accommodate different numbers of multiple tuner applications without creating a significant impact on broadband bandwidth. Finally, the present invention combines high linearity and low noise in a distribution amplifier for multiple tuner applications with a large variable gain range.

Further embodiments, features, and advantages of the present invention, as well as the structure and operation of the various embodiments of the present invention are described in detail below with reference to the accompanying drawings.

BRIEF DESCRIPTION OF THE DRAWINGS/FIGURES

The accompanying drawings, which are incorporated in and constitute part of the specification illustrate embodiments of the invention and, together with the general description given above and the detailed description of the embodiments given below, serve to explain the principles of the present invention. In the drawings:

FIG. 1 is a top level block diagram of a conventional passive splitter triple tuner solution;

FIG. 2 is a top level block diagram of a conventional implementation of a triple tuner solution having a separate low noise amplifier (LNA) at the input of a passive splitter;

DETAILED DESCRIPTION OF THE INVENTION

Figure 3:
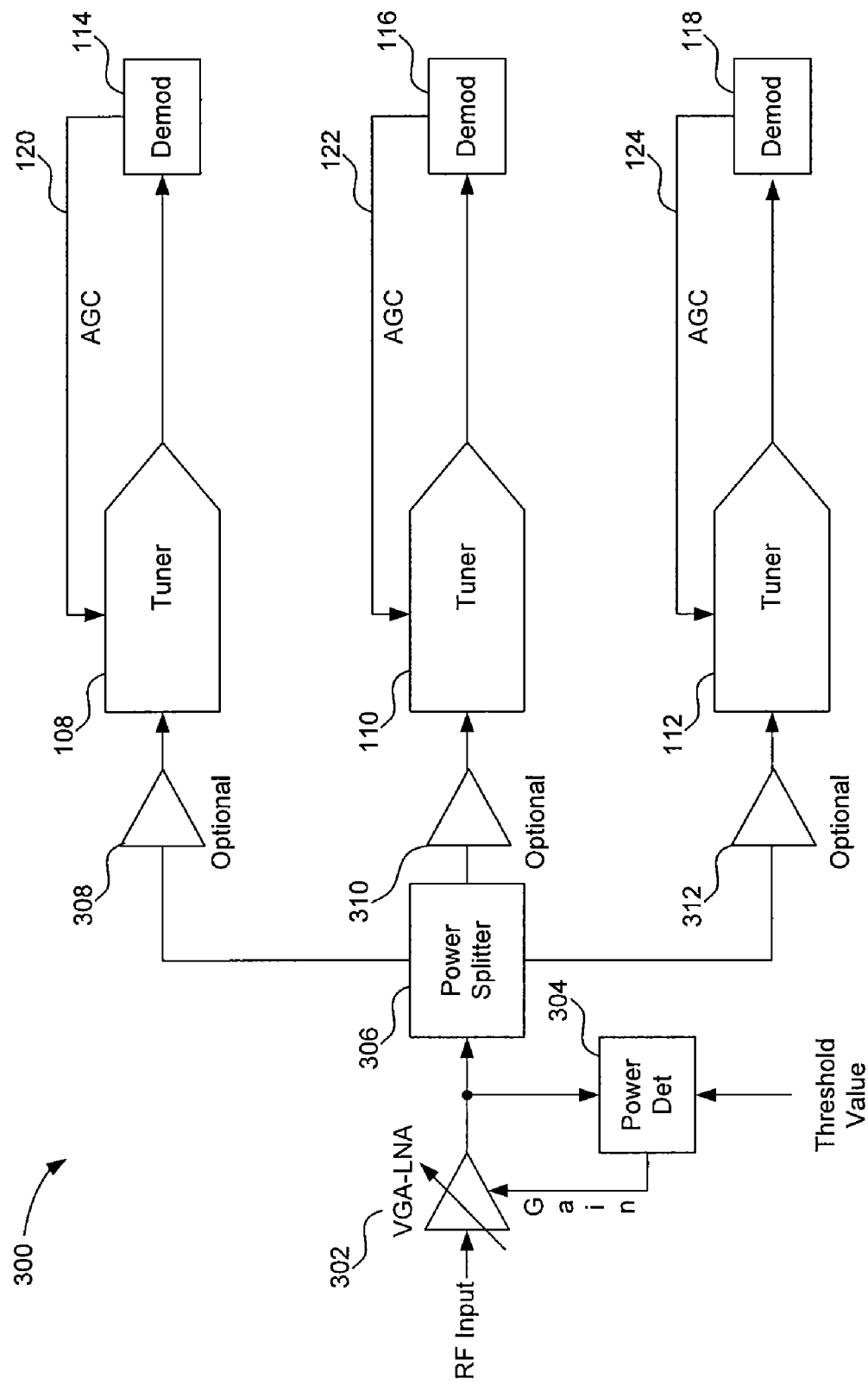
FIG. 3 is a simplified block diagram of an exemplary system constructed and arranged in accordance with the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the figures. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 provides a top level block diagram illustration of a conventional triple tuner solution. In FIG. 1, a triple tuner circuit 100 includes an input port 102 and a passive splitter 106 configured to receive an input signal. The passive splitter 106 receives the input signal and splits the signal into three outputs that are used to drive matching tuners 108, 110, and 112. Many of the conventional approaches position the LNA inside of the tuner itself, providing one IC or discrete solution with the LNA inside.

The splitter 106 merely passively splits the input signal. In so doing, however, the splitter 106 creates insertion losses in accordance with the expression $10 \log_{10} N$, where N=the number of splitter outputs and loss is the amount of attenuation. In FIG. 1, for example, the actual loss appearing at the input of the tuners is about 4.77 dB. Next, the tuners 108, 110, and 112 are respectively coupled to the demodulators 114, 116, and 118. In practice, the tuners 108, 110, and 112 are typically used to derive signals of different frequency bands from the input signal received at the input port 102. The demodulators are provided to demodulate the associated derived signals and extract entertainment programming information therefrom. The demodulators 114, 116, and 118 include respective automatic gain control AGC paths 122, 124, and 126 to control the gain of the circuit 100.

As noted above, the conventional tuner solutions, such as the system 100, include passive splitters which create insertion losses that degrade the performance of the downstream tuners 108, 100, and 112. The insertion losses introduced by the splitter 106, for example degrade signal quality, which in-turn, directly impacts the noise figure, distortion performance, and SNR of associated system amplifiers.

FIG. 2 illustrates another conventional tuner system 200 having improved performance over the system 100 of FIG. 1. In FIG. 2, the tuner system 200 includes the passive splitter 106 used in the system 100 but also includes a fixed gain control LNA 204. The fixed gain LNA 204 helps to avoid the noise figure problems discussed above in association with the tuner system of FIG. 1. Because the gain of the LNA 204 is often on the order of 15 dB, fixed attenuators 206, 208, and 210 are used on the output to reduce the signal level to each tuner to a more reasonable value.

For example, assume the gain of the LNA 204 is 15 dB and its noise figure is 3.5 dB. Assume also that the noise figure of each of the tuners 108, 110, and 112 is about 8 dB. If the total loss from the input of the power splitter 106 to the output of each of the attenuators 206, 208, and 210 is 13.1 dB, the noise figure at the output of each of the tuners remains at 8 dB—no degradation. However, the gain has been increased by 1.9 dB, making the signal level at the output of each tuner almost 2 dB higher. This will result in more distortion.

Instead, assume the combined loss of the splitter 106 and attenuators 206, 208, and 210 is equal to 15 dB. Now each of the tuners 108, 110, and 112 sees an input signal at the same level as that seen at the input of the LNA 204. This results in a noise figure of 9.3 dB at the output of each tuner—an increase of 1.3 dB. Therefore, although the tuner system 200 provides improvements over the system 100 by incorporating the fixed gain LNA 204 in front of the splitter 106, the noise figure or distortion of the system can still be degraded.

FIG. 3 is a top-level block diagram of an exemplary splitter amplifier 300 constructed and arranged in accordance with the present invention. More importantly, the exemplary splitter amplifier 300 provides a solution to the noise figure and distortion problems of FIGS. 1 and 2. In FIG. 3, the fixed gain LNA 204 of FIG. 2 has been replaced by an autonomous, variable gain LNA 302. A power splitter 306 distributes the signal output from the LNA 302 along multiple signal paths. A power detector 304 monitors the output of the LNA 302 to maintain signals that are output therefrom at a constant level.

Specifically, the power detector 304 is configured to receive a threshold level input such that signals output from the LNA 302 that are above a predetermined threshold value will be maintained at a constant level. In other words the gain automatically adjusts itself to compensate for variations in the input signal level so that each of the tuners 108, 110, and 112 receives a signal having a constant level at its input when signal output from the LNA 302 are above the predetermined threshold value. If signals are below the predetermined threshold value, the level of signals received as inputs to the tuners would correspondingly drop. The approach of FIG. 3 insures that the LNA 302 achieves good noise figure performance for low-level signals, while at the same time, achieves good distortion performance for high-level signals.

An additional feature of the splitter amplifier 300 is that it specifically positions the LNA 302 outside of the tuners, which helps improve the dynamic range of the signal path. Many of the conventional approaches position the LNA inside of the tuner itself, providing one IC or discrete solution with the LNA inside. Here, the LNAs 308, 310, and 312 are optionally separated from respective tuners 108, 110, and 112—optional if the LNA is not included in the tuner function. The inventors of the instant invention have discovered, however, that by keeping the LNA separate from the tuners that, among other things, multiple AGC paths can be accommodated without compromising noise figure or distortion.

Figure 4:
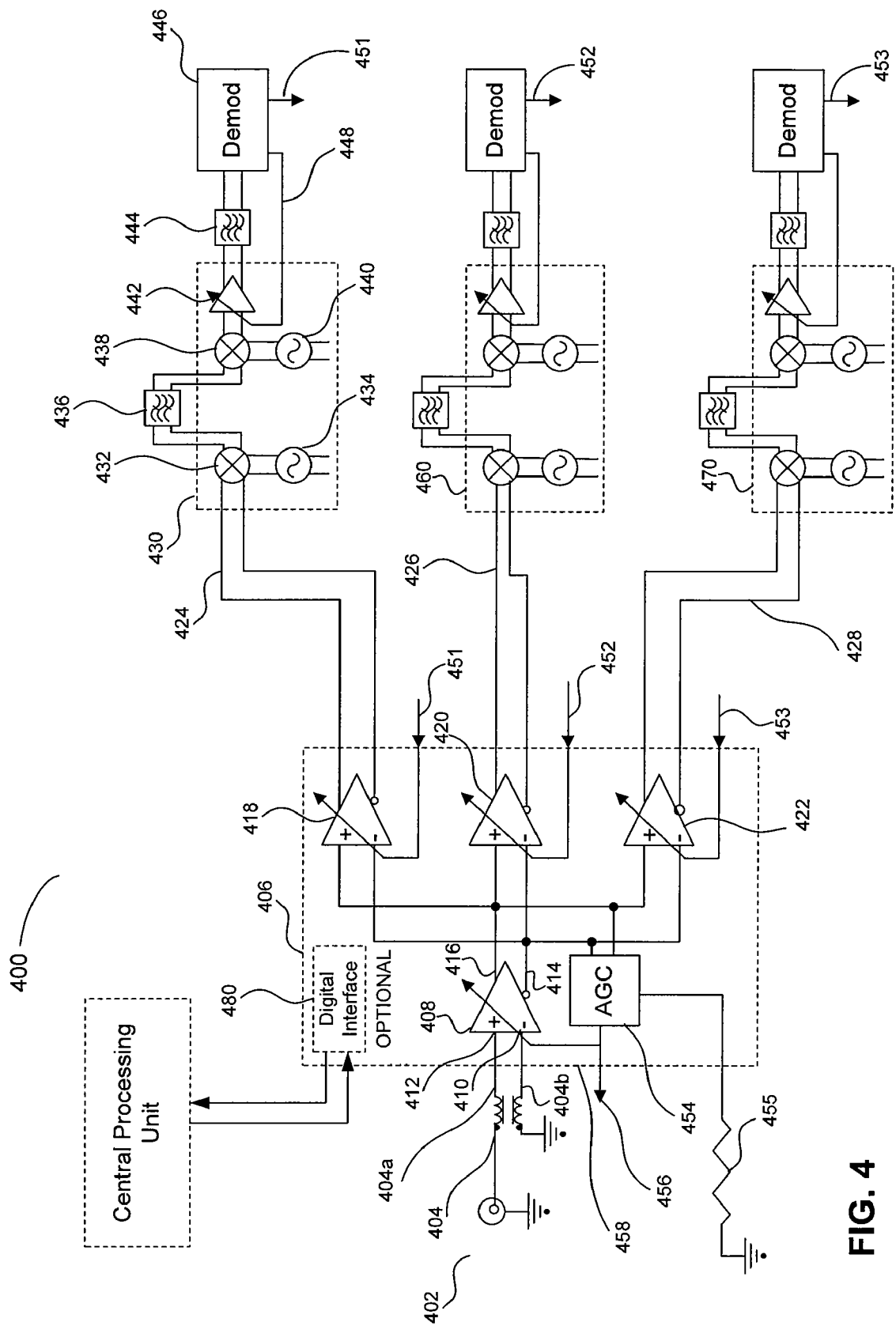
FIG. 4 is a detailed block diagram of another exemplary system constructed and arranged in accordance with the present invention.

FIG. 4 is a more integrated version of the splitter amplifier 300 of FIG. 3 which maintains the LNA separate from the tuners and incorporates multiple AGC paths. In FIG. 4, a tuner system 400 includes an input port 402 configured to receive an input programming material signal. Although the input signal can be of the single-ended or differential variety, most programming type input signals are single-ended because single-ended signals are easier to provide. Thus, for purposes of illustration, the input signal format discussed in the instant invention will be based upon a received single-ended signal.

A mechanism 404 is provided to receive the single-ended input signal and convert it into a differential signal. Although FIG. 4 depicts the mechanism 404 as a balance/unbalance (balun) device, any single-ended to differential signal conversion mechanism or technique can be used. Thus, in the system 400, the balun 404 receives the single-ended signal at the input port 402 and converts it into a differential signal provided to balun output ports 404a and 404b. In an alternative embodiment, the output 404b can be connected to an AC ground, thus converting the input signal to a single-ended signal.

The output differential signal is then provided as inputs to an active splitter amplifier arrangement 406. In addition to noise immunity and common-mode rejection properties inherent in differential input signals, the inventors of the present invention have discovered through experimentation that differential input signals also reduce second order and third order composite distortion products.

Another benefit of using differential signals in active integrated solutions, such as the amplifier splitter 406, is the ability to capitalize on the matching properties offered by ICs. The active splitter 406 includes these matching properties because the low noise amplification function and the splitter function are integrated into a single IC, eliminating the requirement for signals to be passed or coupled from an LNA IC to another IC containing a splitter. As understood in the art, potentially significant levels of noise are introduced into signals each time they are passed from one IC to another. In differential signals, however, any noise is eliminated since only the difference between the positive and negative signal components are amplified.

Third order terms of composite distortion products are minimized because the signal swing across each transistor of the associated differential topology is reduced. Second order distortion is further reduced due to the balanced nature and symmetry of differential input signals. This inherent benefit of differential amplifiers, for example, reduces third order distortion products. The differential topology approach similarly provides significant improvements in the reduction of the second order terms of composite distortion products.

The exemplary embodiment of the present invention illustrated in FIG. 4, therefore, provides a single active amplifier splitter 406, which can be a low noise variable gain amplifier (LNVGA). This single LNVGA performs both the LNA and splitter functions for the tuners shown in the systems 100 and 200 of FIGS. 1 and 2, respectively. The splitter 406 includes a first stage differential amplification module 408, which in-turn includes respective inverting and non-inverting input ports 410 and 412. The amplification module 408 also includes respective inverting and non-inverting output ports 414 and 416. The module 408 provides first stage amplification for a differential input signal received at the input ports 410 and 412 and provides the corresponding differential output signal to a number of second stage amplifiers 418, 420, and 422.

The second stage amplifiers 418, 420, and 422 of the amplifier splitter 406 are integrated with the splitter function. Whereas, the amplifiers 302, 308, 310, and 312 in the conventional system 300 of FIG. 3, are physically separate from the splitter 306. The LNAs being separated from the splitter, as implemented in the conventional system 300, creates the need to maintain at least a 75 ohm impedance transmission line system. Integrating the function of the splitter and the LNA, as accomplished in the present invention, enables system designers to simply parallel the amplifiers without the need of maintaining 75 ohm impedance lines. Although three second stage amplifiers are discussed herein for purposes of illustration, any number of amplifiers can be used to accommodate particular user and/or system requirements.

The second stage amplifiers 418, 420, and 422 provide differentially amplified signals along differential signals transmission lines 424, 426, and 428 to respective tuners 430, 460, and 470. Providing differential signals as inputs to the tuners 430, 460, and 470 helps to suppress any noise generated between the tuners and the LNAs. Providing the differential transmission lines 424, 426, and 428 also inherently provides higher impedance transmission lines. Specifically, the differential lines provide about 200 ohms of differential impedance, which helps maintain the overall power consumption.

Since each of the tuners 430, 460, and 470 along the signal paths 424, 426, and 428 are substantially identical, the discussion of the tuner 430 will apply equally to the tuners 460 and 470. Furthermore, although a specific tuner implementation is shown in FIG. 4, numerous other tuner approaches can be used. In the exemplary system 400, after the differential signal is amplified, it's provided as an input to a mixer 432. The mixer 432 mixes the amplified signal up to a predetermined frequency based upon a signal provided by a local oscillator 434. As noted above, the tuners 430, 460, and 470 do not include LNAs, which helps to reduce the dynamic range of the associated signal path.

Next, the signal is provided off-chip to a high intermediate frequency (HI-IF) filter 436. In one embodiment, a surface acoustic wave (SAW) filter is used because of its very narrow bandwidth and flat group delay properties. However, any suitable narrow-band filter arrangement (e.g., filters having five or fewer channels) can be used. The differential signal is then provided to another mixer 438 that mixes the signal down based upon a signal provided by another local oscillator 440. A low frequency VGA 442 receives the signal output from the mixer 438, provides a final level of amplification, and then provides the signal to a standard intermediate frequency (IF) filter 444. The standard IF filter 444 could be a SAW or a lumped element (LC) filter. The filtered signal is then provided to a demodulator 446.

The demodulator 446 can be, for example, a set-top box chip, a cable modem, or a PVR, etc. In the system 400, the demodulator 446 not only demodulates the differential signal processed along the path 424, but it also controls the gain of an output stage of the tuner 430. Additionally, the demodulator 446 controls the gain of a corresponding output buffer (not shown), and controls the gain of the second stage amplifiers 418, 420, and 422.

The demodulator 446 controls a gain of the tuner 430 by monitoring the quality and level of signals output from the tuner 430 and providing a control signal to the VGA 442 along a feed back path 448. The control signal is used to adjust the gain of the VGA 442 in accordance with the quality of a particular channel selected by the user. The demodulator 446 controls the gain of its corresponding output buffer to further optimize the SNR of the signal associated with the selected cable channel, thus compensating for system cable losses.

At a broader level, the demodulators, including the demodulator 446, control the gain of the second stage amplifiers 418, 420, and 422 in order to compensate for different modulation schemes. Here, for example, the demodulator 446 provides a gain control signal 451 to an AGC control device (not shown). The AGC control device is included in the output buffer and in-turn, provides the gain control signal 451 to the second stage amplifier 418 to provide gain control thereto. Similarly, the demodulators along the signal paths 426 and 428 provide respective gain control signals 452 and 453 to the second stage amplifiers 420 and 422 respectively. Alternatively, the demodulators can be configured to directly control the gain of the second stage amplifiers 418, 420, and 422 via analog signals output from each of the demodulators.

Other implementations of the tuners as well as the AGC control functions are possible. In alternative embodiments, the amplifiers 418, 420, and 422 can be controlled digitally via an inter-integrated (I$^2$C) circuit-like digital interface 480. Other exemplary implementations of the AGC control function include the use of arrangements such as an external voltage. A specific alternative embodiment of the amplifier 406 and the AGC control feature will be discussed in greater detail below.

In the embodiment of FIG. 4, gain in the first stage amplification module 408, and thus to an extent, the overall gain of the active amplifier splitter 406, is controlled by an AGC block 454. The AGC block 454 can be, for example, a power detector that monitors the differential signal output from the amplification module 408 to determine the amount of gain needed. Specifically, the level of the module 408 output signal is compared with a predetermined threshold signal produced via a resistor 455. Since the resistor 455 is not within the module 408, the predetermined AGC threshold can be adjusted externally. A control signal 456 is produced and forwarded to an input of the amplification module 408 along a feedback path in order to adjust its input in accordance with the threshold comparison.

Figure 5A:
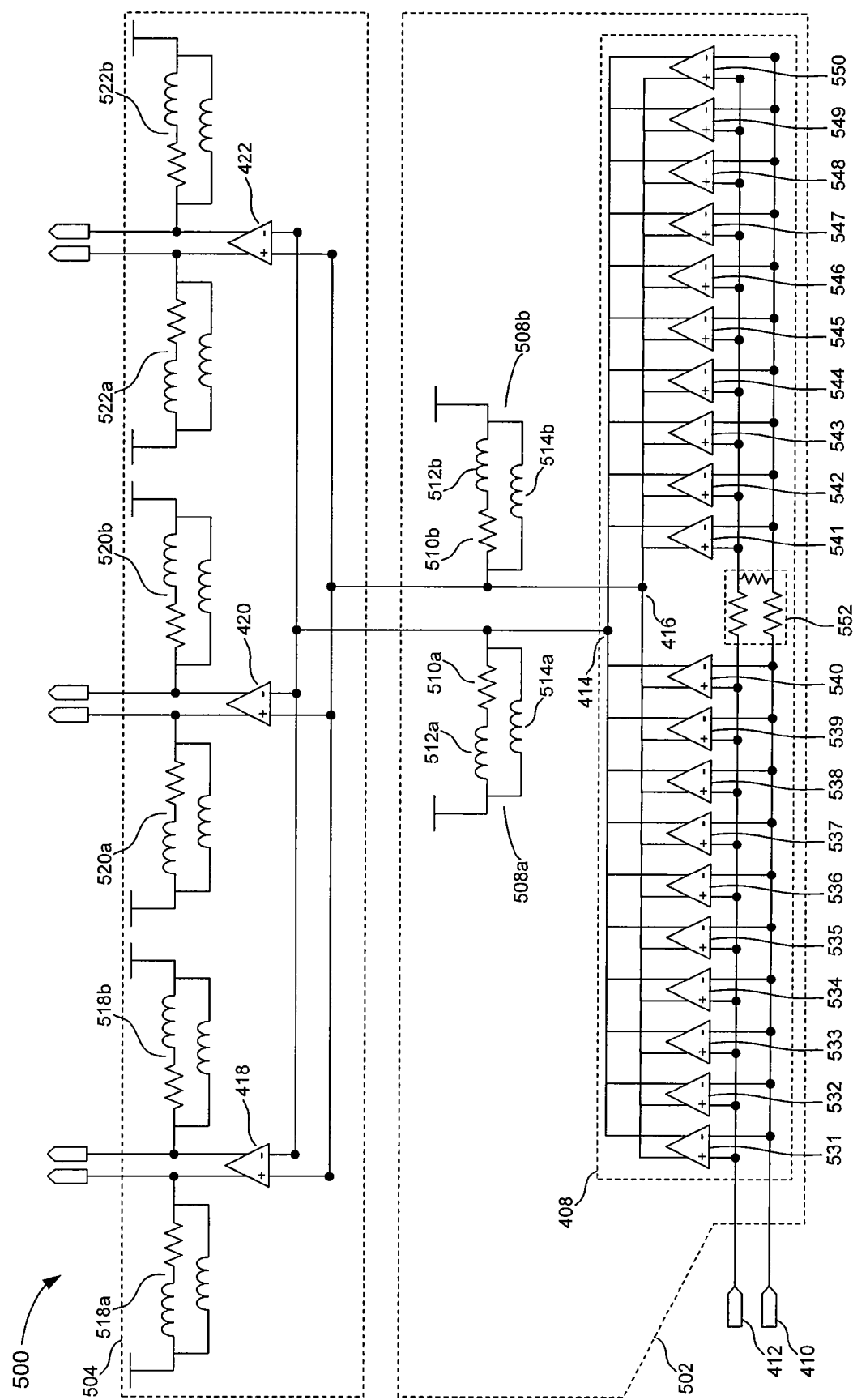
FIG. 5A is a circuit level illustration of amplifiers used in the system of FIG. 4.

FIG. 5A provides a more detailed illustration of the first stage amplification module 408 and the second stage amplifiers 418, 420, and 422. In FIG. 5A, a multistage amplification arrangement 500 includes a first stage section 502 and a second stage section 504. The first stage section 502 includes the amplification module 408 coupled to inductor/resistor devices 508a and 508b. A specific function of the amplification module 408 is to provide low noise gain for the received input signal and provide overall dominant AGC for the entire system 400, as discussed above. The inductor/resistor devices 508a and 508b are used to provide, for example, bandwidth enhancements when driving a parasitic capacitance load. The resistive part of the inductor/resistor devices 508a and 508b are also used to set the voltage gain. Although any suitable device can be used, for purposes of illustration, the load devices 508a and 508b are formed of a series resistor-inductor combination load.

Each inductor/resistor device 508a and 508b respectively includes resistors 510a and 510b, and inductors 512a and 512b. Additionally, inductors 514a and 514b, used as radio frequency (RF) chokes, are respectively connected across the resistor combination loads 512a/510a and 512b/510b. In other words, the inductors 514a and 514b are essentially a DC short but present a high impedance in the particular frequency band of interest. One terminal of the load device 508a is coupled to an output terminal 414 and one terminal of the load device 508b is coupled to an output terminal 416 of the amplification module 408. The load devices and inductors can be off-chip in both the first and second stage sections 502 and 504 respectively.

The inductors 512a and 512b are series peaking inductors. The corresponding resistors 510a and 510b act as a resistive load, with the respective inductors 512a and 512b acting to flatten out the bandwidth. The inductors 514a and 514b are provided as a means to achieve a DC short in order to obtain voltages on the output terminals 414 and 416 as high or as close to $V_{DD}$ as possible in order to maximize distortion performance in the first stage section 502.

The second stage section 504 includes the amplifier 418 having inductor/resistor devices 518a and 518b connected across its differential output ports. The other amplifiers 420 and 422 include inductor/resistor devices 520*a*/520*b* and 522*a*/522*b* connected and functioning in the same manner discussed above in relation to the first stage section 408. That is, the inductor/resistor devices of the second stage section 504 operate to maximize its distortion performance. The operation of the amplification module 500 will now be discussed in greater detail.

Figure 5B:
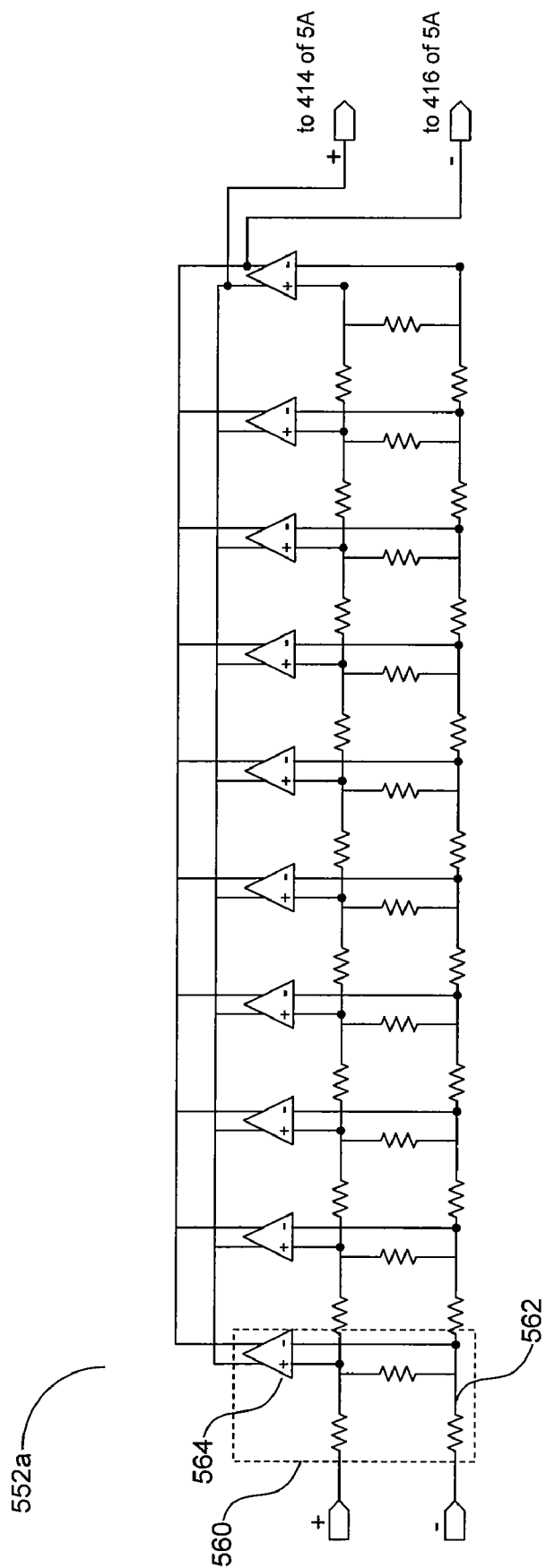
FIG. 5B is an alternative embodiment of a resistor divider used in the amplifiers of FIG. 5A.

The amplification module 408, as indicated above, includes the differential input ports 410 and 412 and is comprised of two groups of 10 VGAs 531 through 550 connected in parallel. As shown in FIG. 5A, each of the amplifiers 531 through 550 includes differential input ports. The inverting and non-inverting input leads of the differential amplifiers 531 through 550 are connected to the input ports 410 and 412 respectively. In the first stage section 502, signals provided as inputs to the amplifiers 531 through 540 are unattenuated. On the other hand, signals input to the amplifiers 541 through 550 are attenuated by a predetermined amount via an attenuator 552. In the instant embodiment, the attenuator 552 is a resistor divider that provides about 15 dB of attenuation. FIG. 5B, however, is an illustration of an alternative embodiment 552*a* of the attenuator 552. Although two groups of amplifiers are described in FIG. 5A, any number of amplifiers can be used in order to achieve desirable system performance requirements.

In FIG. 5B, the alternative attenuator 552*a* is constructed by dividing the attenuator 552 of FIG. 5A into multiple successive portions 560, each including a resistor network 562 having an amplifier 564 connected across its output. The portion 560 is differentially connected to the other portions of the attenuator 552*a*. That is, the differential input ports of one portion of the attenuator 552*a* are respectively connected to the differential input ports of a successive portion of the attenuator 552*a*. Each of the portions 560 provides about 1.5 dB of attenuation. The total attenuation of the attenuator 552*a* is therefore about 15 dB—substantially the same as the attenuator 552 of FIG. 5A. In FIG. 5B, however, the amplifiers 564 can be selectively activated to provided a means of tapping particular sections of the attenuator 552*a* to provide a greater and finer number of attenuation settings on the way down the chain of portions 560. The attenuator 552*a*, by dividing the attenuator 552 into multiple sections, provides for better overall distortion performance in intermediate gain settings.

Returning to FIG. 5A, the second stage section 504 provides a plurality of outputs to drive each of the tuners 430. Gain control provided by the demodulator 446 assists in fine tuning the level of individual signals selected when the user changes or tunes to a particular channel.

Figure 6:
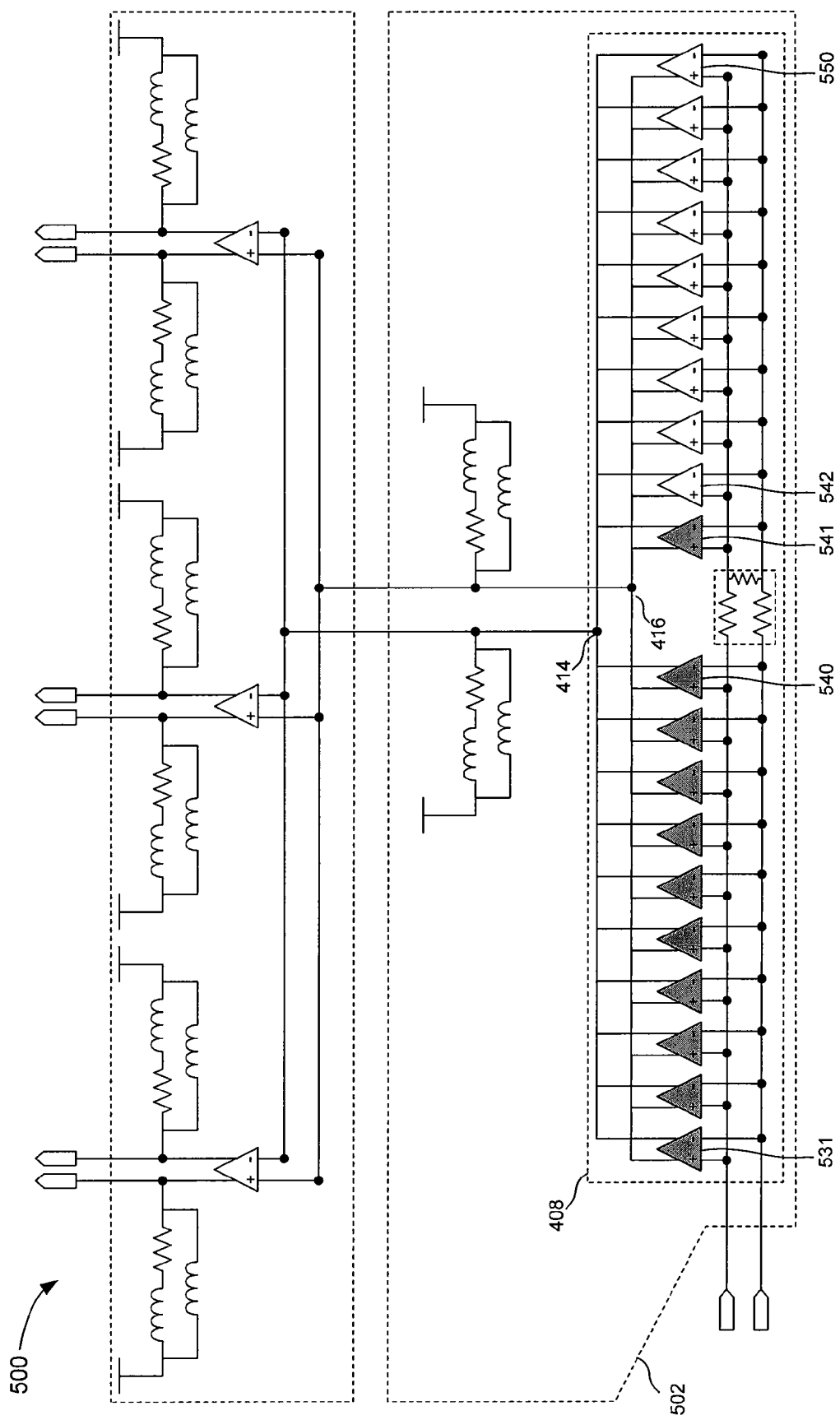
FIG. 6 is an illustration of the circuit of FIG. 5A at a maximum gain setting.

During operation of the first stage section 502, only 11 adjacent amplifiers in the amplification module 408 are powered-up to achieve a particular gain setting. FIG. 6 illustrates an exemplary maximum gain setting mode of the first stage amplification module 408. In order to set the module 408 to its maximum gain setting, the amplifiers 531 through 540 are each set to their maximum gain level and the amplifier 541 is set to a minimum gain level. The remaining amplifiers 542 through 550 are completely powered-off. In a third alternative embodiment, the amplifiers 541-550 may be omitted and ten more section 560*s* may be added to FIG. 5B The overall gain of the amplification module 408 is reduced by decreasing the gain of the amplifier 531 and simultaneously increasing the gain of the amplifier 541 until the amplifier 531 is at its minimum gain level and the gain of amplifier 541 is at its maximum gain level. After minimum gain is reached in the amplifier 531, it is completely powered-off. The amplifier 531 must be completely powered off because if it remains powered up, even at a minimum gain value, it will introduce parasitic feed-through which will reduce the overall linearity performance of the amplification module 408.

FIG. 6 illustrates the process of powering the amplifiers 531-550 up and down. As noted above, the gain of the amplifier 531 is decreased while the gain of the amplifier 541 is simultaneously increased in order to decrease the overall gain of the amplification module 408. In other words, the amplifiers 531 and 541 are operating at the same time but at opposite polarities. This process or requiring simultaneous operation insures that the gain of the amplifiers can go smoothly from a higher value to a lower value and vice versa without first wiggling up and/or down. After the amplifier 531 is faded out and its output is no longer contributing to the amplification module 408, it is completely powered down. This process continues (i.e., additional amplifiers being powered up and down), until the amplification module 408 reaches its minimum gain setting.

Figure 7A:
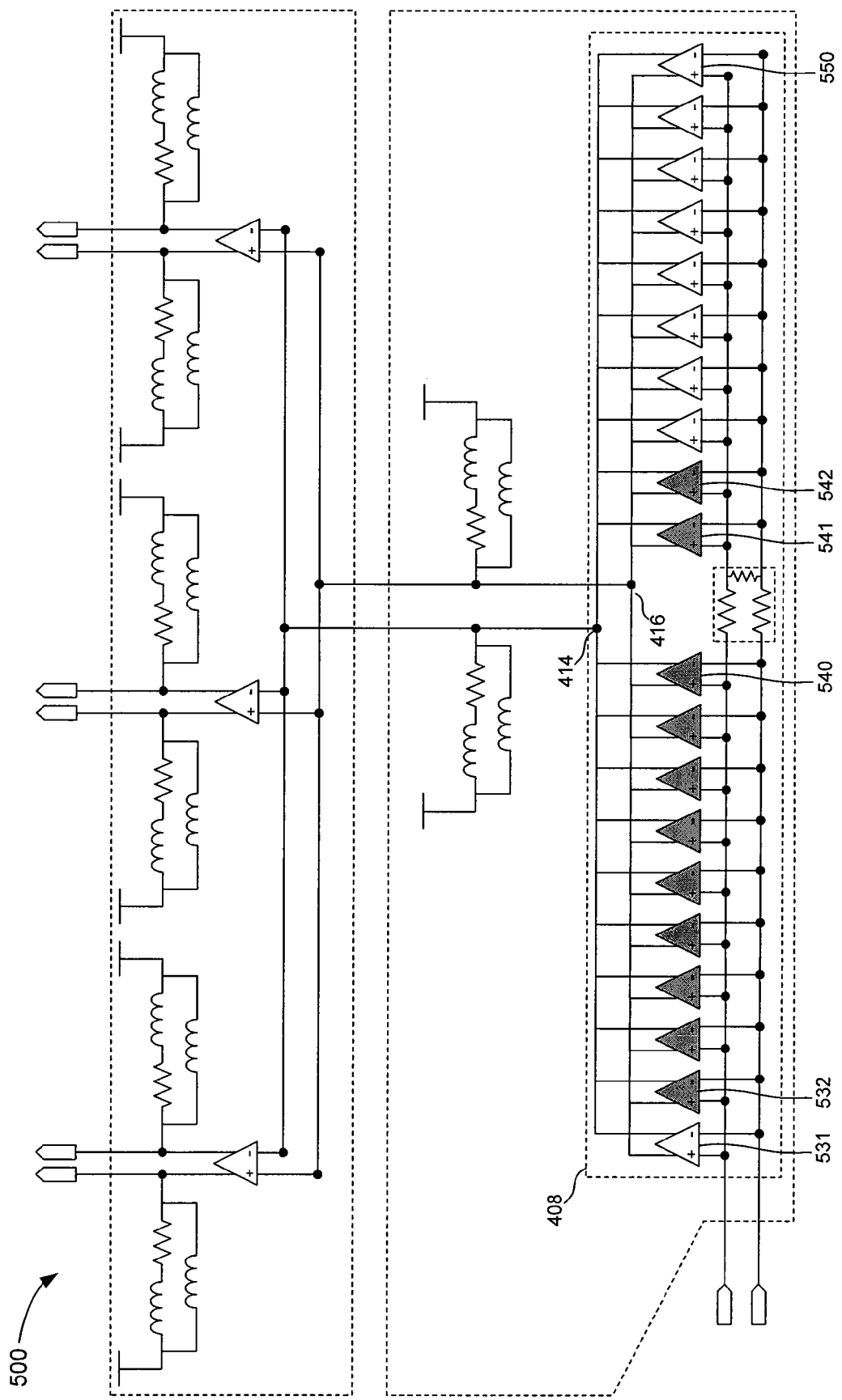
FIG. 7A is an illustration of the circuit of FIG. 6 configured for a reduced gain.
Figure 7B:
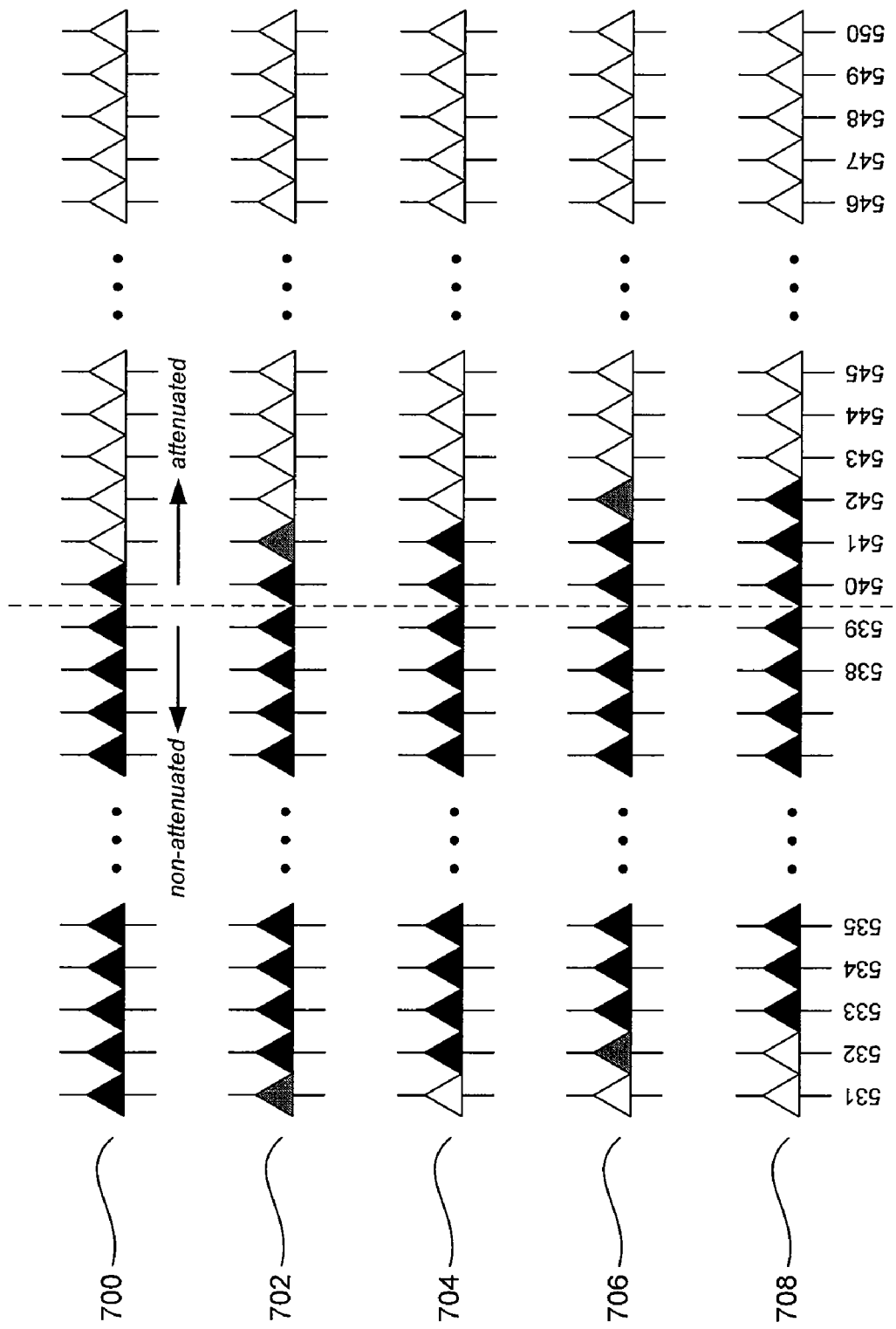
FIG. 7B is an illustration of a process for reducing gain in the exemplary embodiment of FIG. 7A.

FIG. 7A also illustrates a further reduction of the overall gain of the amplification module 408. In the module 408, as the amplifier 531 is turned completely off, the amplifier 542 is powered on at a minimum gain value. The gain of the amplifier 532 can then be decreased and the gain of the amplifier 542 can be increased until the amplifier 532 is at its minimum gain value and the amplifier 542 is at its maximum gain value. FIG. 7B more clearly illustrates the process of reducing the gain of the amplification module 408 from a maximum setting to a minimum setting.

In FIG. 7B, the rows 700-708 represent progression of the process of decreasing gain in the amplification module 408 by simultaneously powering down and powering up corresponding amplifiers. The row 700 depicts 10 non-attenuated amplifiers at maximum gain. As the gain in the amplification module 408 begins to decrease in row 702, the amplifier 531 begins to power down as the amplifier 541 simultaneously begins to power up. In the row 704, the amplifier 531 is completely turned off at the moment the amplifier 541 is completely turned on. Next, the amplifier 532 begins to power down as the amplifier 542 simultaneously begins to power up, as indicated in the row 706. Finally, the amplifier 532 is completely turned off at the moment the amplifier 542 is completely turned on.

Figure 8A:
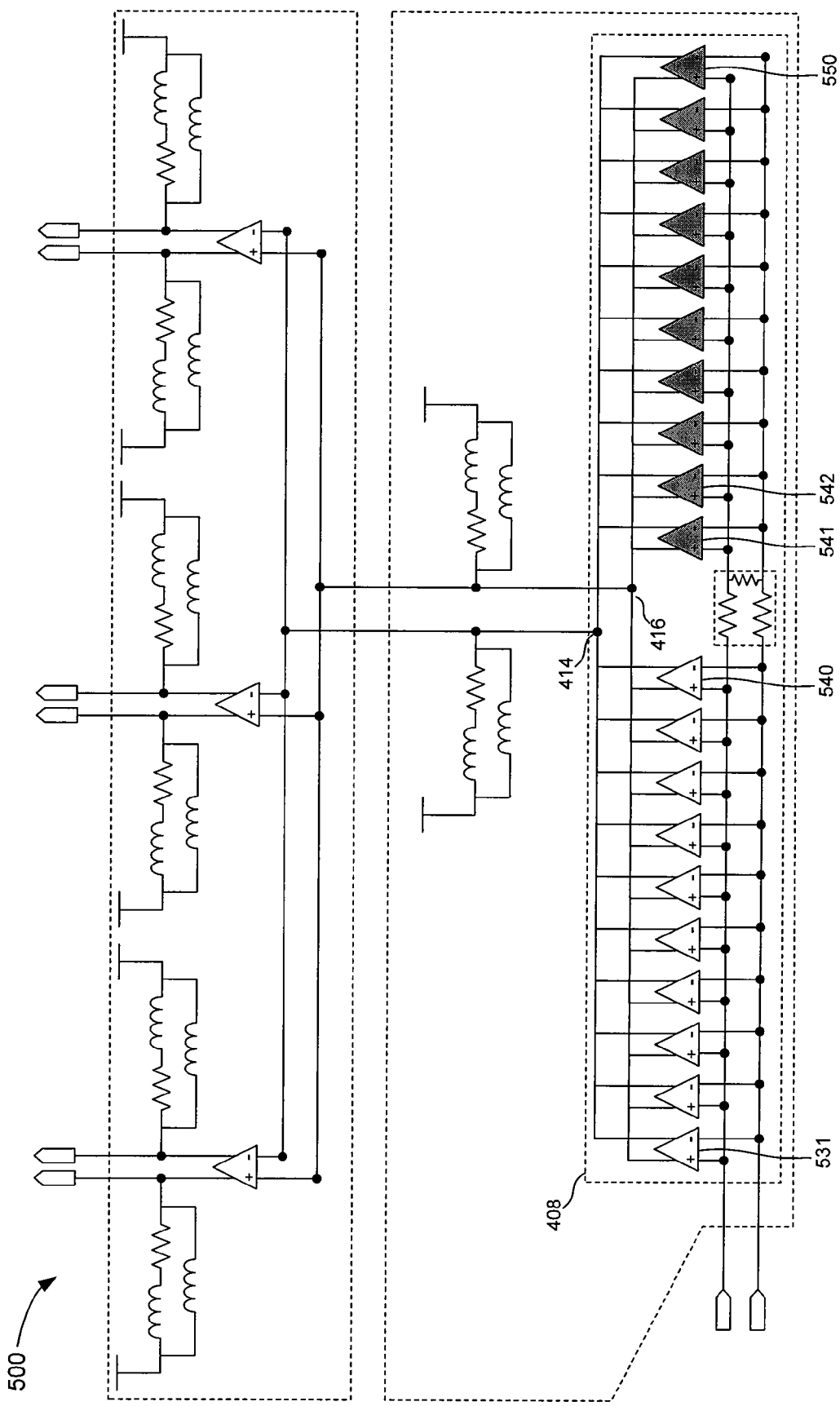
FIG. 8A is an illustration of the circuit of FIG. 7A configured for additional gain reductions.

The gain of the amplification module 408 is further reduced as this process is continued until all of the amplifiers 531 through 540 are powered-off, and the amplifier 541 through 550 are set to their maximum gain value. In this mode, which is illustrated in FIG. 8A, the overall gain of the amplification module 408 is now about 15 dB below the maximum gain setting illustrated in FIG. 6.

To achieve an additional gain reduction, the gain of the amplifier 541 is reduced until it reaches minimum gain. After its minimum gain setting is achieved, the amplifier 541 is completely turned off. This process of turning off the amplifiers after the minimum gain has been achieved, is continued through the remainder of the amplifiers 542 through 550 until only a minimum number of amplifiers remain on.

Figure 8B:
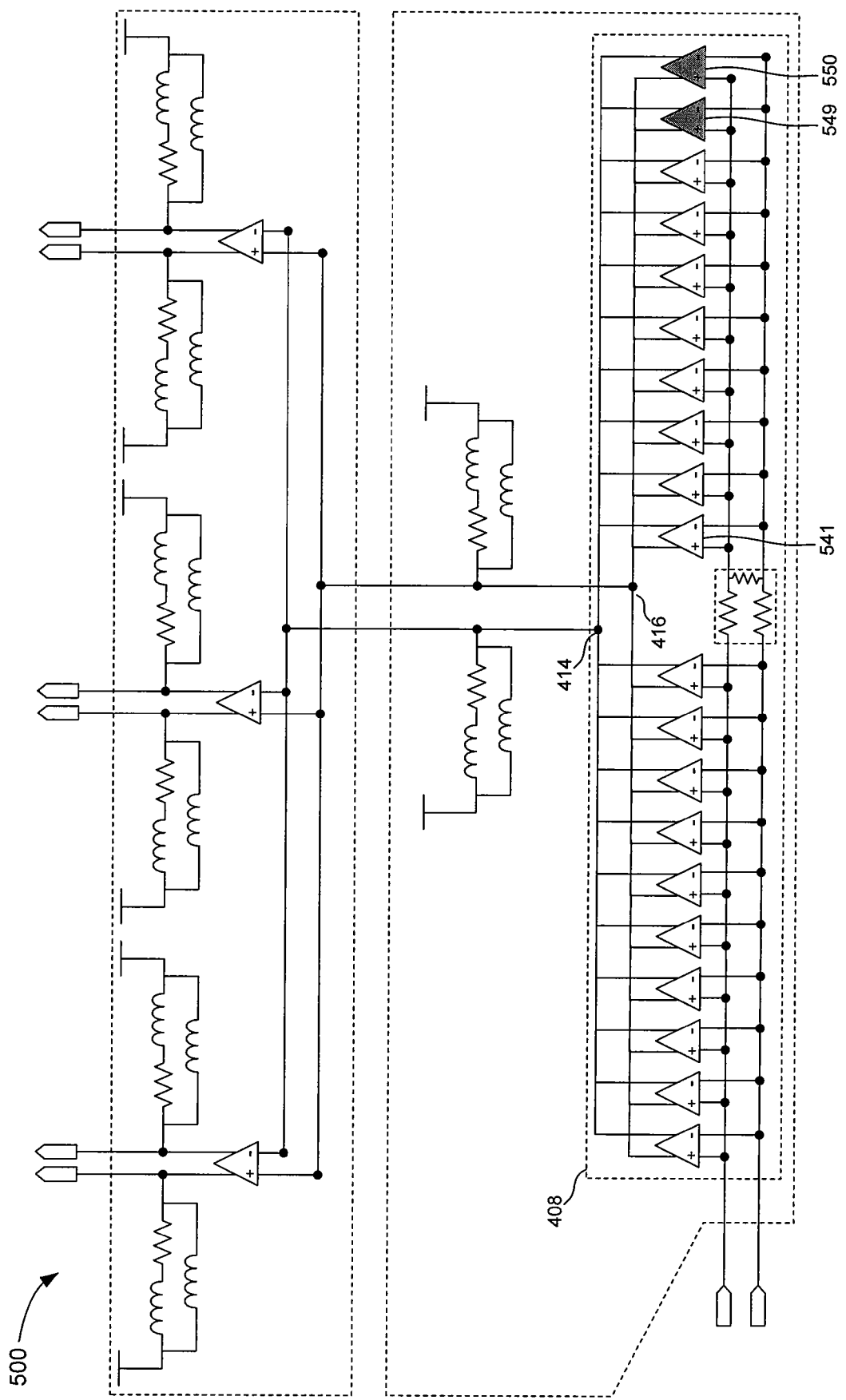
FIG. 8B is an illustration of the circuit of FIG. 8A configured for minimum gain.

FIG. 8B illustrates an exemplary case where the amplifiers 549 and 550 are left on at their maximum gain value settings in order to achieve an overall minimum gain value condition for the amplification module 408. Although the illustration of FIG. 8B depicts the use of two amplifiers remaining on at their maximum gain, any suitable number of amplifiers, including zero, can be used. The inventors of the present invention have discovered through experimentation, however, that 1-3 amplifiers remaining on is an acceptable number to achieve optimal operation of the amplification module 408 at its minimum gain level. The minimum gain of the amplification module 408 is balanced against the minimum number of powered-on amplifiers needed to maintain acceptable bandwidth flatness and linearity characteristics. If more amplifiers are turned off than the minimum limit, more gain reduction is achieved but the parasitic capacitance produces frequency feed-through and degrades the bandwidth flatness and overall linearity performance of the amplification module 408.

Figure 9:
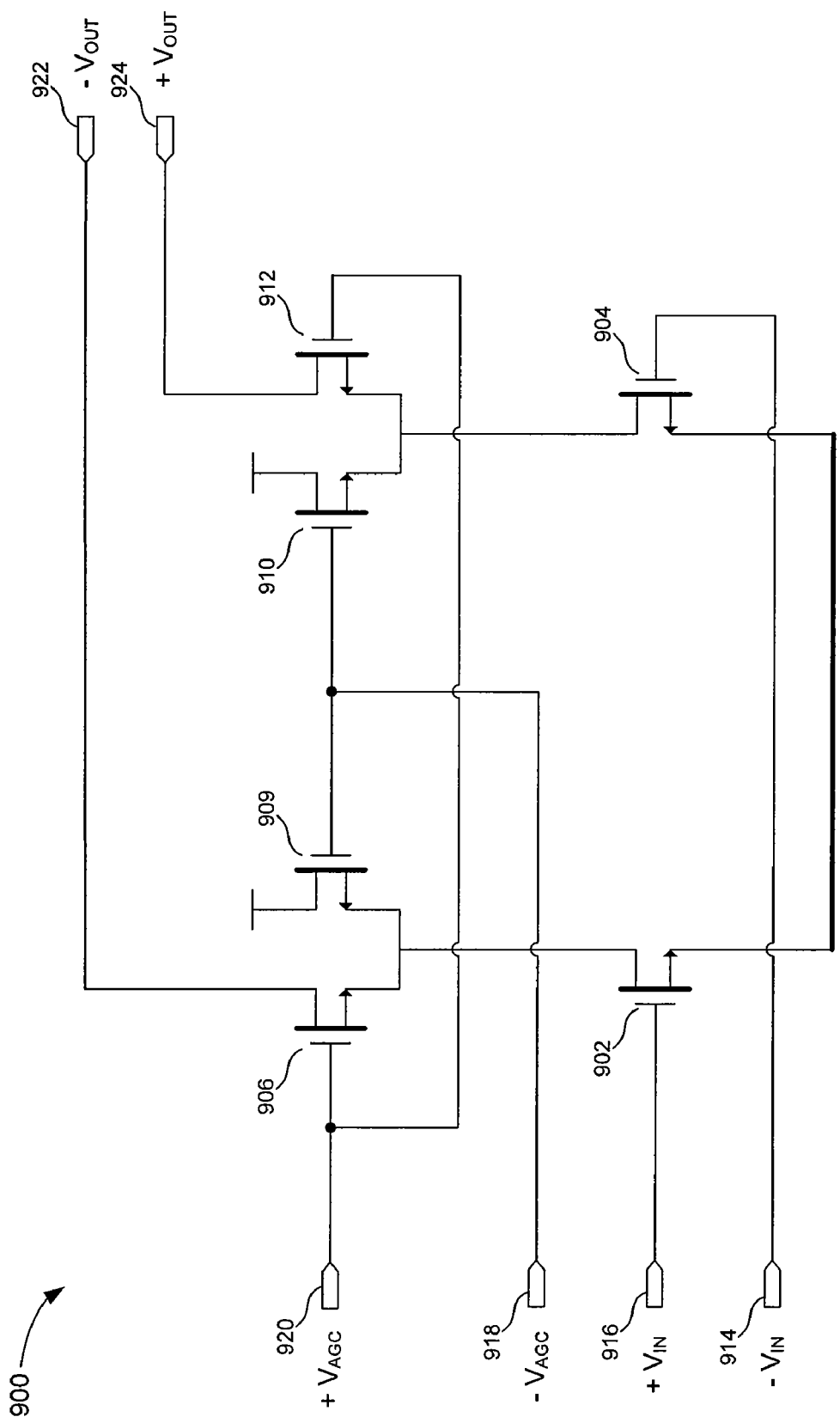
FIG. 9 is a circuit level diagram of one of the first stage amplifiers shown in the circuit of FIG. 5A.

FIG. 9 is an illustration of an exemplary circuit diagram that can be configured for use as the amplifiers 531 through 550 shown in FIGS. 5A-8B. In FIG. 9, an amplifier circuit 900 includes input active devices 902 and 904. Although other active device types can be used, the active devices in the embodiment of FIG. 9 are implemented using one or more transistors, which can be field effect transistors (FETs) or bi-polar devices.

Next, a transistor pair including active devices 906 and 909 is also provided in FIG. 9, with the device 906 acting as a cascode for the device 902. Similarly, another transistor pair includes transistor devices 910 and 912, where the transistor device 912 acts as a cascode for the device 904. Also included in the circuit 900 are respective inverting and non-inverting drive voltage input ports 914 and 916 as well as inverting and non-inverting AGC drive voltage input ports 918 and 920, respectively. Finally, inverting and non-inverting output ports 922 and 924 are also provided.

In the circuit 900, the maximum gain occurs when a maximum AGC drive voltage is applied to the input terminal 920 and a minimum AGC drive voltage is applied to the input terminal 918. In other words, the amount of signal permitted to go through the devices 906 and 912 can be varied, based on the signal swing across the input ports 918 and 920 in accordance with the applied drive voltage signals. Thus, for example, in the case of the input device 902 the output current can be steered either partially or completely through the device 906 or the device 909 based upon the AGC drive voltage across the input ports 918 and 920.

Therefore, if a gate voltage of the device 906 is higher than a gate voltage of the device 909, more of the current will be steered through the device 906 to the output port 922. If the AGC drive voltage is completely tilted such that the device 906 is completely on and the device 909 is completely deactivated, then all of the output signal will go through to the inverting output port 922. This mode is representative of the circuit 900 configured for a maximum gain value setting. One advantage of this technique is that the linearity of the circuit 900 is greatly improved despite the presence of gain reducing signals such as second and third order inter-modulation products.

Figure 10:
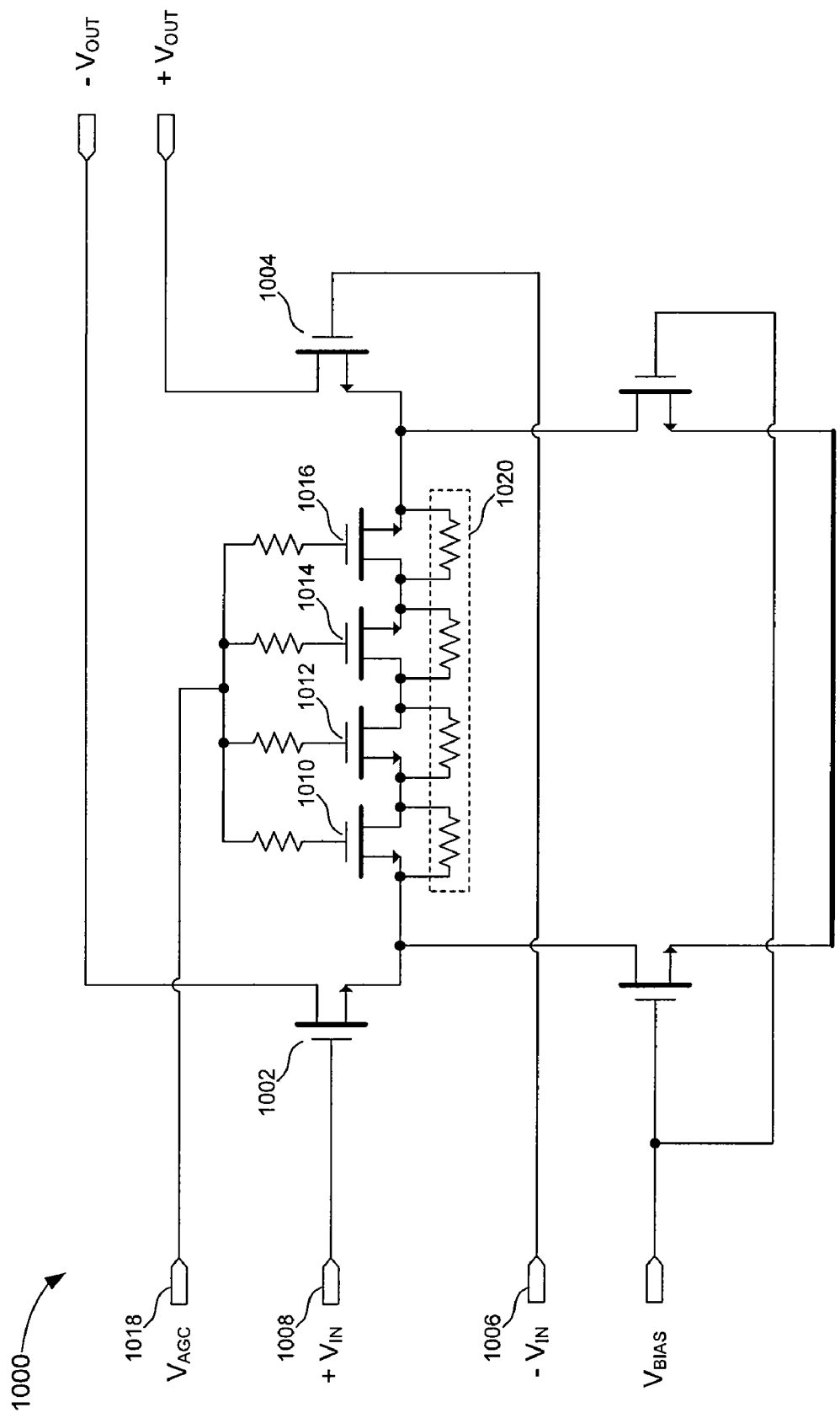
FIG. 10 is a circuit level diagram of one of the second stage amplifiers shown in the circuit of FIG. 5A.

FIG. 10 illustrates an exemplary circuit 1000 that can be used as the second stage amplifiers 418, 420, and 422. Since the noise performance of the second stage amplifiers 418, 420 and 422 is not as critical as the noise performance of the amplification module 408, a much more simplified circuit arrangement can be utilized. The circuit 1000 includes input transistor devices 1002 and 1004 for receiving inverting, and non-inverting input drive signals via inverting and non-inverting input ports 1006 and 1008, respectively.

The input devices 1002 and 1004 form a differential pair amplifier which includes devices 1010, 1012, 1014, and 1016 provided for controlling gain, and a source degeneration mechanism 1020. As a voltage level of an AGC voltage signal received via an AGC drive voltage input terminal 1018 is increased, channel resistance of the devices 1010, 1012, 1014, and 1016 is decreased by the degeneration mechanism 1020 and the gain of the circuit 1000 is thereby increased. The amplifiers 1010 through 1016 are at a minimum gain when the received AGC drive voltage is zero volts and a maximum gain when the AGC drive voltage is substantially equal to the circuit supply voltage $V_{DD}$.

An advantage of the circuit 1000 is that it provides a more simplified approach for varying amplifier gain. Additionally, the devices 1010-1016 provide better linearity because the signal swing across any one device is reduced. Active device such as FETs, operate as linear resistors only when the drain source voltage is zero. Thus, any signal present will appear at the sources of the input devices 1002 and 1004, and subsequently across the devices 1010-1016. By using a large number of FETs in series, any signal present can be broken into smaller segments. The resistors at the gates of the devices 1010-1016 are high-value resistors, essentially making the gates floating, in terms of AC. The resistors within the degeneration device 1020 are used to keep a limited voltage across the devices 1010-1016. In so doing, the circuit 1000 is providing a limited AGC range. The range is limited on one end, for example, when all of the devices 1010-1016 are off, the resistors 1020 keeps the voltage across the devices 1010-1016 reduced.

In the circuit 1000, when the gates of the transistor devices 1010-1016 are activated by the AGC drive signal, all of the transistors 1010-1016 are turned on, creating a variable resistance. As the voltage level of the AGC drive signal is increased, the resistance across the devices 1010-1016 becomes smaller, producing a maximum gain in the amplifier circuit 1000.

The circuit arrangement 1000 improves linearity but does not maintain constant linearity because its linearity varies as the resistance across the device 1020 varies. This effect hurts the overall noise and distortion performance of the circuit arrangement 1000. However, the circuit 1000 is acceptable for the purposes for which it is used in the present invention because the noise performance of the amplifiers 418, 420, and 422 is not as important as the noise performance of the amplification module 408. Therefore, although the circuit 1000 is suitable for use in the second stage amplifiers 418, 420, and 422, it is not desirable for use in the first stage amplification module 408.

Figure 11:
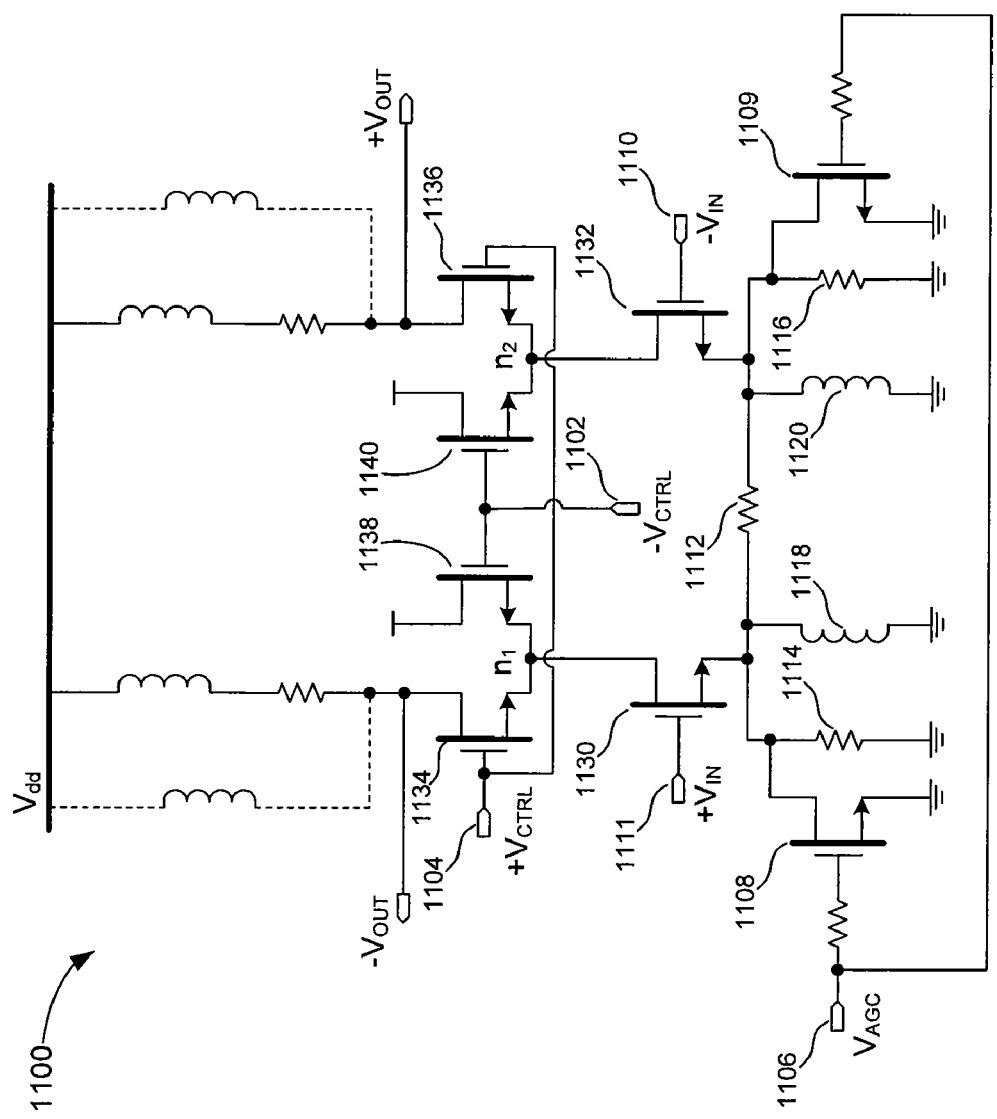
FIG. 11 is an alternative embodiment of the first stage amplifiers shown in FIG. 5A and configured to provide increased common-mode rejection.

FIG. 11 provides an alternative arrangement to the amplifier circuit 900 illustrated in FIG. 9. FIG. 11 is a combination of the current steering technique discussed in relation to FIG. 9, and the active degeneration technique discussed in relation to FIG. 10. In FIG. 11, a circuit 1100 includes respective inverting and non-inverting input ports 1102 and 1104 for receiving respective non-inverting and inverting control voltages.

Also included in the circuit 1100 is an AGC voltage input port 1106 and transistor devices 1108 and 1109, which are cooperatively used to provide source degeneration. In FIG. 11, the inverting and non-inverting control voltages received via the input ports 1102 and 1104, control the gain of the circuit 1100 in a manner similar to the current steering technique discussed above. Also, the AGC voltage received via the input port 1106 controls the process of active source degeneration associated with the devices 1108 and 1109. Respective inverting and non-inverting differential input ports 1110 and 1111 are configured to receive an input differential signal. Resistors 1112, 1114, and 1116 limit the extent of the source degeneration. Finally, inductors 1118 and 1120 are provided to reduce common-mode gain of the circuit 1100 and to reduce DC voltage associated with the source degeneration process. In summary, the circuit 1100 provides an alternative arrangement that has better common-mode rejection than the circuit 900 illustrated in FIG. 9.

Figure 12A:
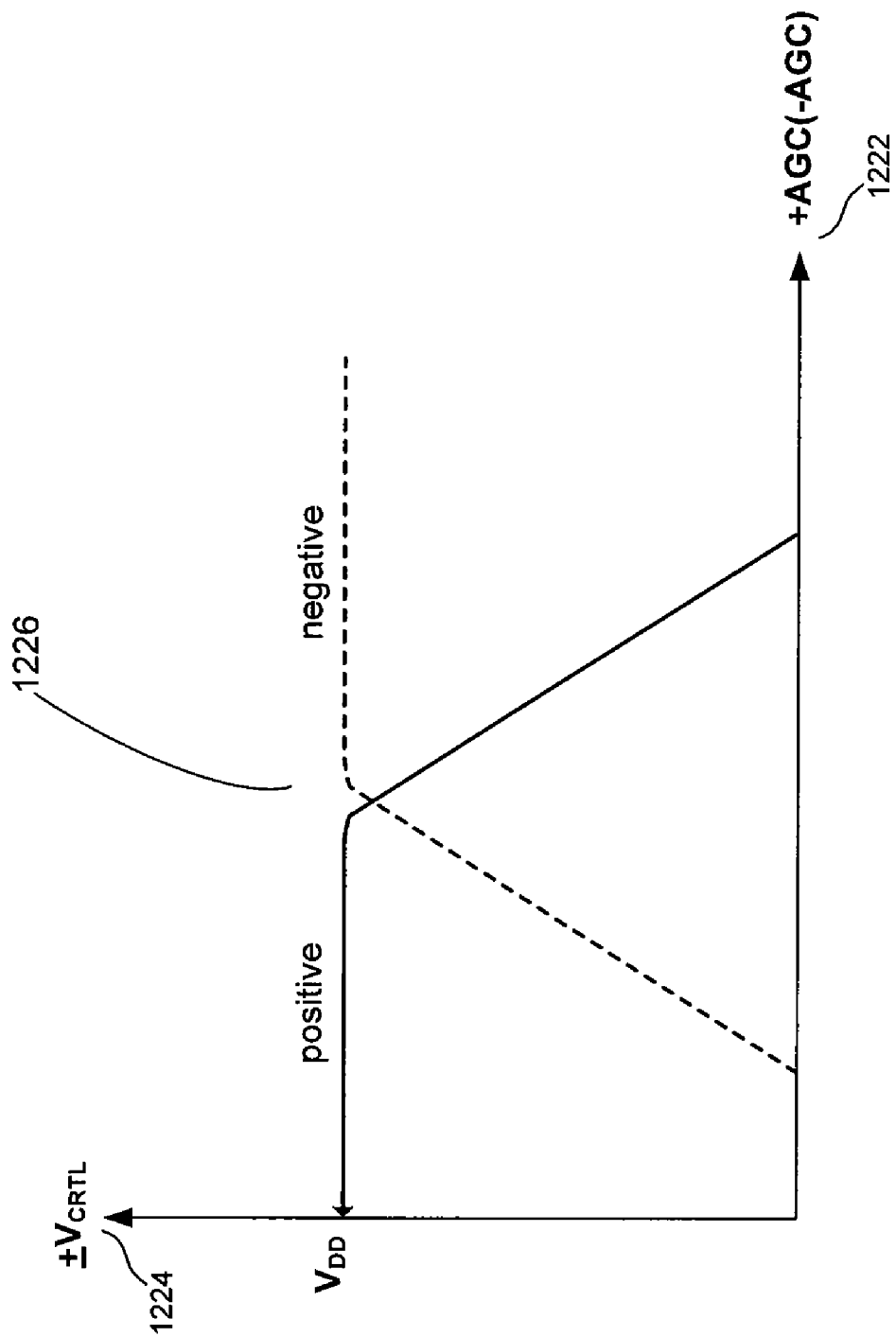
FIG. 12A is a graphical illustration of a signal used to drive the exemplary arrangement of FIGS. 9 and 11.

One goal with the circuit 1100 is to maintain a maximum amount of voltage across lower differential transistor pair 1130 and 1132. This is achieved in the circuit 1100, for example, by keeping voltages at source nodes n1 and n2, as high as possible over the AGC control range, preferably near $V_{DD}$. This arrangement helps to maintain desirable noise and linearity performance within the circuit 1100. To keep the voltages at source nodes n1 and n2 high, the gate voltages $+V_{CTRL}$ and $-V_{CTRL}$ must also be kept as high as possible. With one of the gate voltages $+V_{CTRL}$ or $-V_{CTRL}$ high, the other can be cranked low. For example, if $+V_{CTRL}$ is held near $V_{DD}$, then $-V_{CTRL}$ can be cranked lower with the voltage at n1 and n2 being kept at a high value. The voltages at n1 and n2 will basically be close to the value of the highest of $+V_{CTRL}$ and $-V_{CTRL}$, minus about ½ to ⅘ths of a volt. The key to the circuit 1100, is to keep at least one of the voltages $+V_{CTRL}$ or $-V_{CTRL}$ high. FIG. 12A graphically depicts the desirable drive voltage necessary for maintaining proper operation of the circuits 900 and 1100.

In FIG. 12A, the solid and dotted lines are representative of $+V_{CTRL}$ (positive) and $-V_{CTRL}$ (negative), respectively. The horizontal line 1222 depicts a magnitude of the +AGC and −AGC voltages. The vertical line 1224 depicts a magnitude of the $+/-V_{CTRL}$ voltages. As shown in the graph, when the AGC voltage, along the axis 1222 is at its minimum value, the $-V_{CTRL}$ is much lower than $+V_{CTRL}$, with $+V_{CTRL}$ being equal to $V_{DD}$, along the axis 1224. When this happens, transistors 1134 and 1136 of FIG. 11 are fully turned on, and transistors 1138 and 1140 are fully turned off. Therefore, all the current will flow into the load from the transistors 1130 and 1132. As the AGC voltage is changed along the axis 1222, the $-V_{CTRL}$ voltage begins to increase, while $+V_{CTRL}$ remains the same, sitting near $V_{DD}$. When the AGC voltage reaches a middle level, $+V_{CTRL}$ and $-V_{CTRL}$ are equal, thus forming a cross-over point 1226, which is slightly lower than $V_{DD}$. In other words, the cross-over point 1226 formed by an intersection of $+V_{CTRL}$ and $-V_{CTRL}$ is close to $V_{DD}$. This keeps the voltage at the nodes n1 and n2 as high as possible.

Figure 12B:
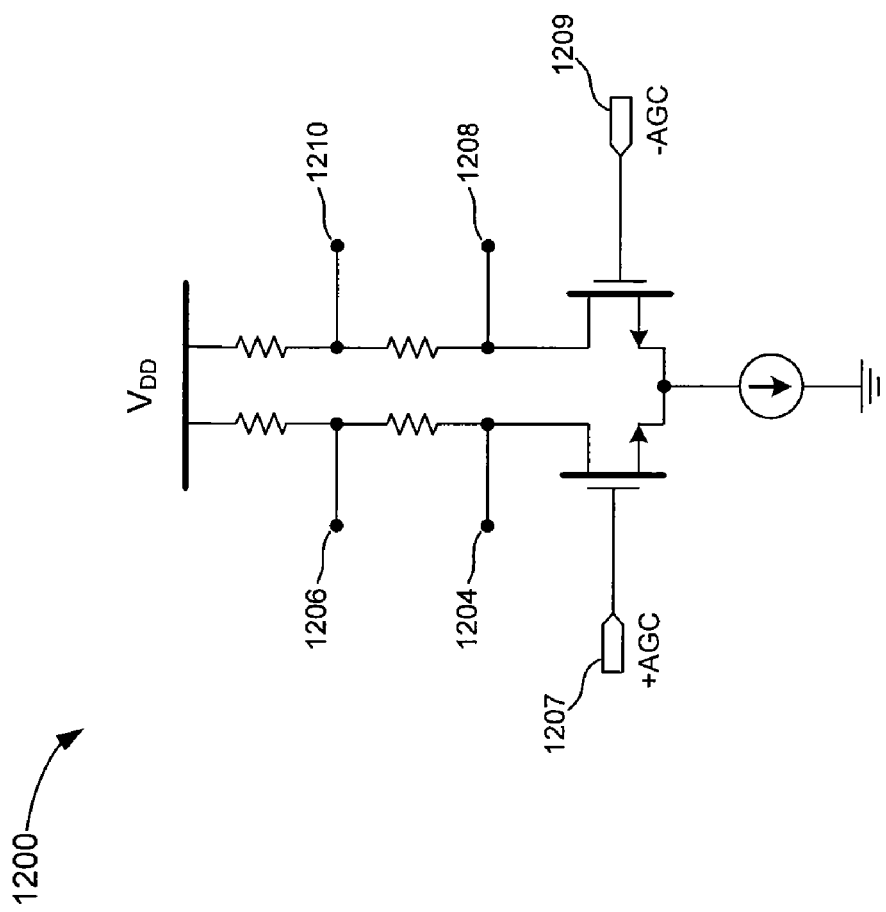
FIG. 12B is a schematic diagram of a first portion of an exemplary circuit for controlling voltage headroom of the circuit of FIGS. 9 and 11.
Figure 12C:
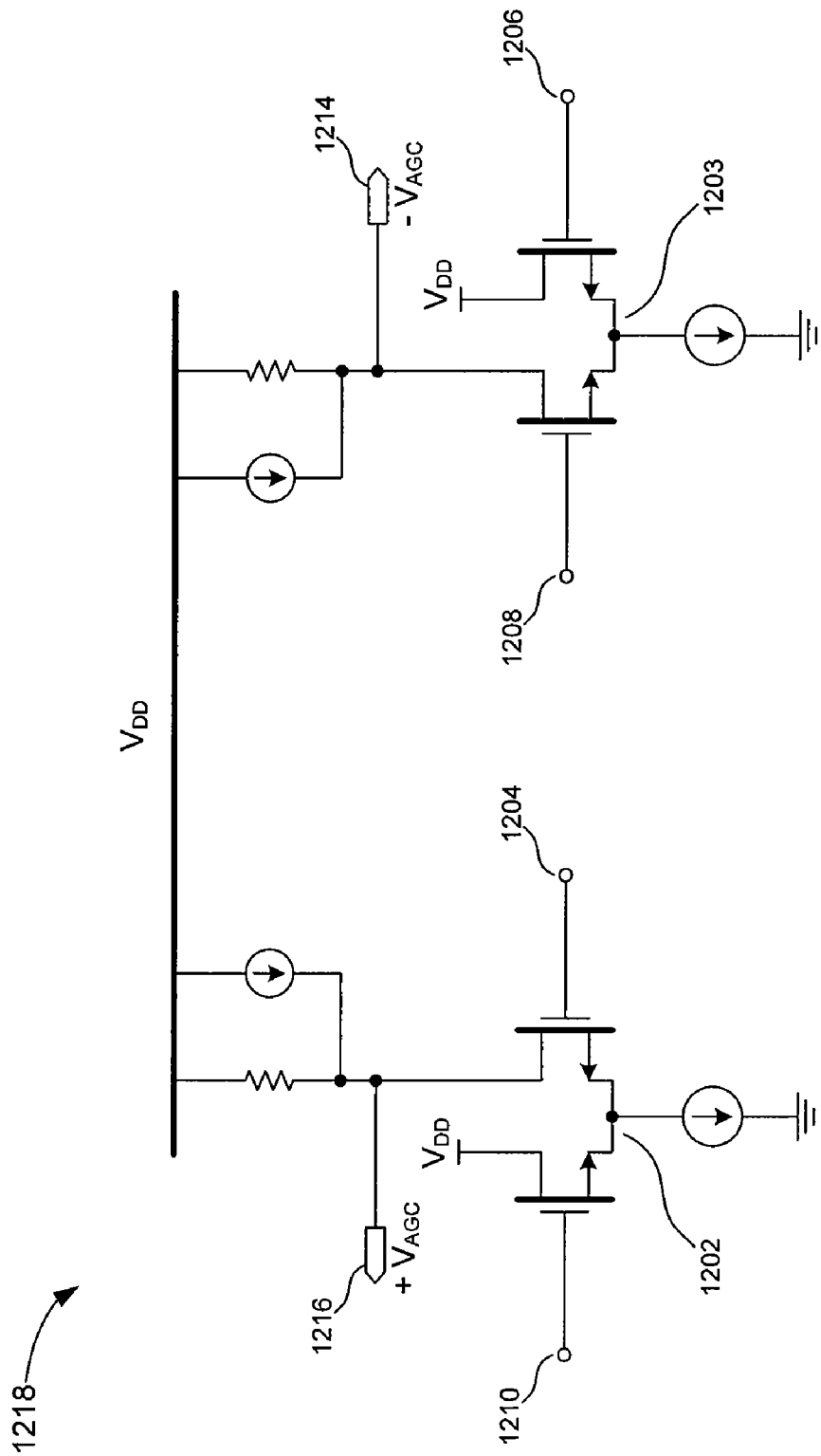
FIG. 12C is a schematic diagram of a second portion of an exemplary circuit for controlling headroom in the circuit of FIGS. 9 and 11.

FIG. 12B provides an illustration of a first portion 1200 of an exemplary circuit arrangement used to provide the AGC drive voltage signal used in the current steering circuit 900 of FIG. 9 and the circuit 1100 of FIG. 11. FIG. 12C presents a second portion 1218 of the exemplary circuit arrangement. In particular, the first and second circuit portions 1200 and 1218 cooperatively provide the ability to maximize headroom in the device 900 by controlling its input active devices 902 and 904. Headroom maximization is desirable for achieving sufficient linearity in the circuit 900. Headroom and linearity can be maximized by maintaining a large drain source voltage across the devices 902 and 904 during operation.

A large drain-source voltage across the devices 902 and 904 is achieved, for example, by insuring that its cascode, active device 909, is completely on before beginning to deactivate the active device 906. Activation in this manner prevents the lowering of the common-source voltage of the devices 906 and 909, which is the drain of the device 902. Lowering the common-source voltage will reduce the headroom and jeopardize the linearity performance of the device 902. The first and second portions 1200 and 1218 are configured to provide a drive signal at the inputs 918 and 920 of the circuit 900 that is capable of facilitating the desired headroom and linearity characteristics.

More particularly, the exemplary circuit 1200 of FIG. 12B is configured to provide differential output signals having offset voltages. The differential output signals are then provided as inputs to the second circuit portion 1218 of FIG. 12C. FIG. 12B includes a differential amplifier with split resistor loads having differential input ports 1207 and 1209 configured to receive a differential AGC bias signal. The circuit 1200 is also configured to receive an input supply voltage signal $V_{DD}$. Two pairs of skewed differential output ports 1204/1208 and 1206/1210 are provided and match the input ports depicted in the circuit 1218 of FIG. 12C.

The circuit 1200 produces a first differential output signal at the output ports 1204 and 1208 and a second differential output signal at the output ports 1206 and 1210. The first and second differential output signals have different voltage levels and are configured to drive the circuit 1218. The inventors of the present application have discovered that a voltage difference within a range of about 1.5 to 2.5 volts is suitable. Thus, during operation, the circuit 1200 provides the first and second differential output signals, that are also responsive to the supply voltage signal $V_{DD}$, as inputs to drive the circuit 1218.

The circuit 1218 of FIG. 12C includes two differential pair amplifier circuits 1202 and 1203 and differential input ports 1204, 1206, 1208, and 1210. Also included in the circuit 1218 are inverting and non-inverting AGC drive signal output ports 1214 and 1216 configured to provide the AGC drive signal for input to the current steering circuit 900. The circuit 1200 is energized by the supply voltage signal $V_{DD}$. During operation, the first differential output signal is provided to the differential input ports 1204 and 1208 of the active devices 1202 and 1203 respectively. The second differential output signal is provided to the differential input ports 1210 and 1206 of the active devices 1202 and 1203 respectively. In response, the circuit 1218 produces a differential output drive signal $V_{AGC}$ at the differential output ports 1214 and 1216.

Careful adjustments can be made to the differential output drive signal $V_{AGC}$ and/or to the differential input AGC bias signal to provide a signal having a magnitude and waveform characteristics appropriate for maximizing headroom and linearity in the circuit 900. FIG. 12A graphically illustrates a desirable relationship between magnitudes of the supply voltage signal $V_{DD}$, the input AGC bias signal, and the output drive signal $V_{AGC}$ for maximizing headroom and linearity.

Figure 13:
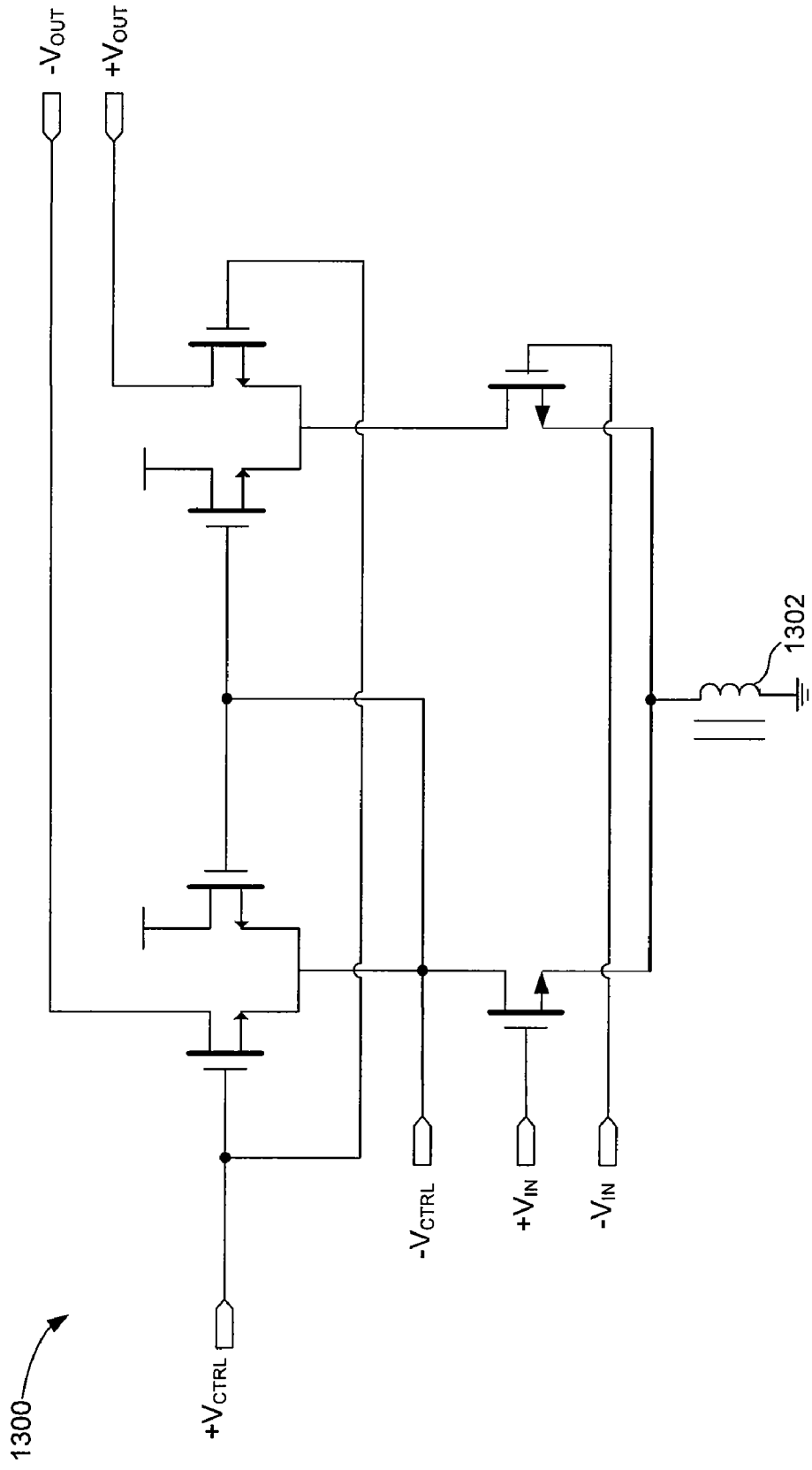
FIG. 13 is an alternative embodiment of the circuit shown in FIG. 11.

FIG. 13 illustrates a circuit 1300 that is an alternative embodiment of the circuit arrangement 1100 shown in FIG. 11. The circuit 1300 provides further improvements in the second order distortion characteristics over the circuit 1100. Improved second order distortion is key to achieving optimal cable tuner LNA performance. In FIG. 13, the circuit 1300 includes an RF choke 1302 used in a common-source arrangement to reduce common mode gain while, at the same time, not reducing the DC voltage headroom across the other active circuit devices. In a preferred embodiment of the present invention, the RF choke 1302 has a large AC impedance and zero DC impedance. The RF choke 1302 is also an off-chip component due to the technical challenges associated with fabricating on-chip RF chokes.

Figure 14:
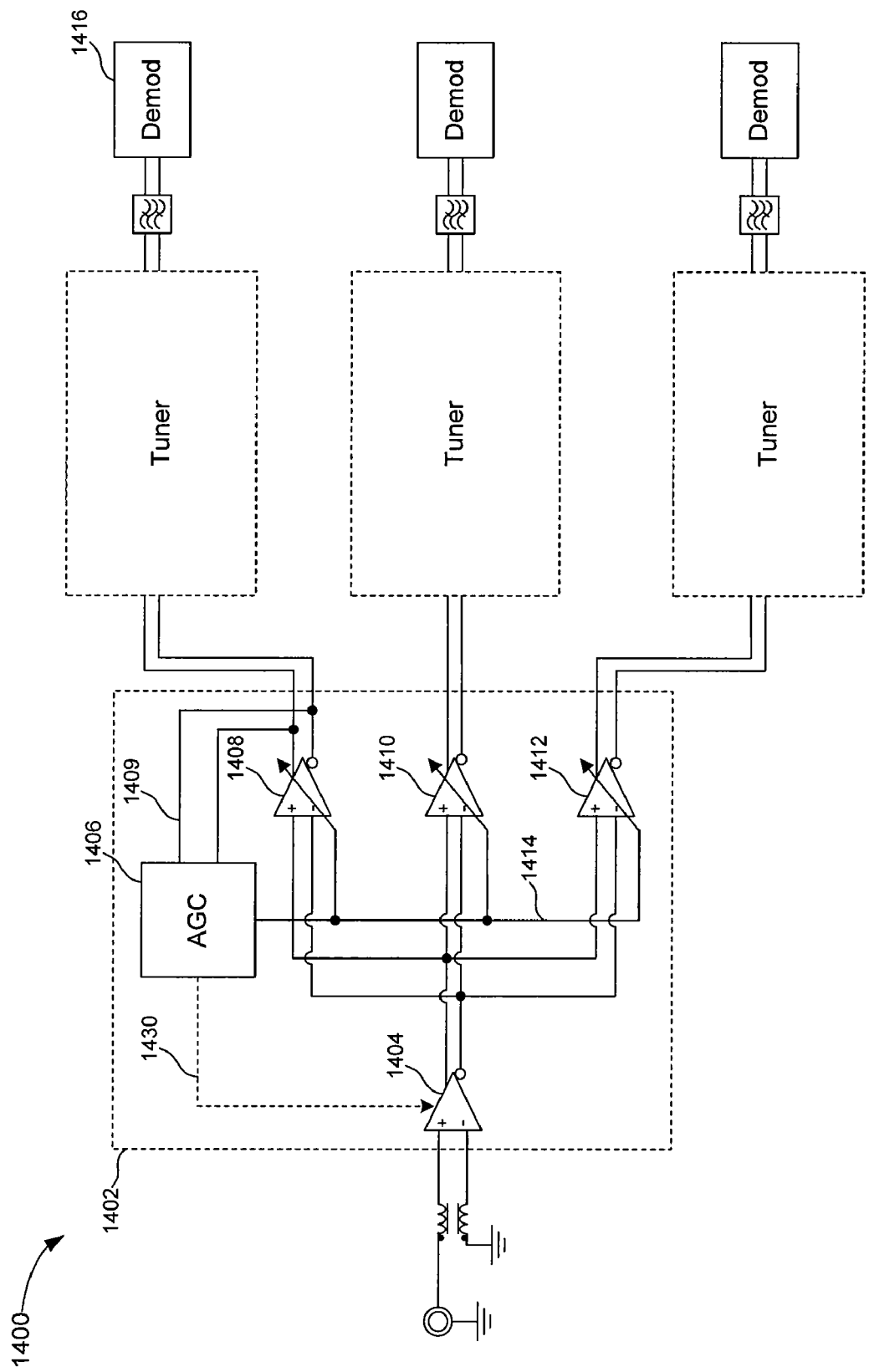
FIG. 14 is a top level block diagram of an alternative embodiment of the exemplary system shown in FIG. 4.

FIG. 14 is an alternative embodiment of the circuit 300 shown in FIG. 3 and includes a circuit arrangement 1400. The arrangement 1400 includes an amplification module 1402 with a completely autonomous and independent AGC function. Independent and autonomous AGC provides the amplification module 1402 with the ability to maximize the system's SNR. Stating that the AGC function is autonomous means that the AGC function is controlled completely and independently within the amplification module 1402. In the circuit arrangement 400 of FIG. 43, for example, the gain of the second stage amplifier 418 is controlled by the demodulator 450. As discussed in relation to FIG. 4, the amplification module 1402 can be, for example, an LNVGA.

In FIG. 14, the amplification module 1402 includes a first stage device 1404, a self-contained AGC mechanism 1406, and second stage amplifiers 1408, 1410, and 1412. The AGC mechanism 1406 facilitates autonomous AGC control across the entire spectrum of set-top boxes and cable modems, as an example. The AGC mechanism 1406 is configured to produce a constant level for the output signal to each tuner as opposed to having the gain controlled by some other down-stream device. In this manner, the SNR of signals can be maximized to each tuner from the amplification module 1402.

Figure 15:
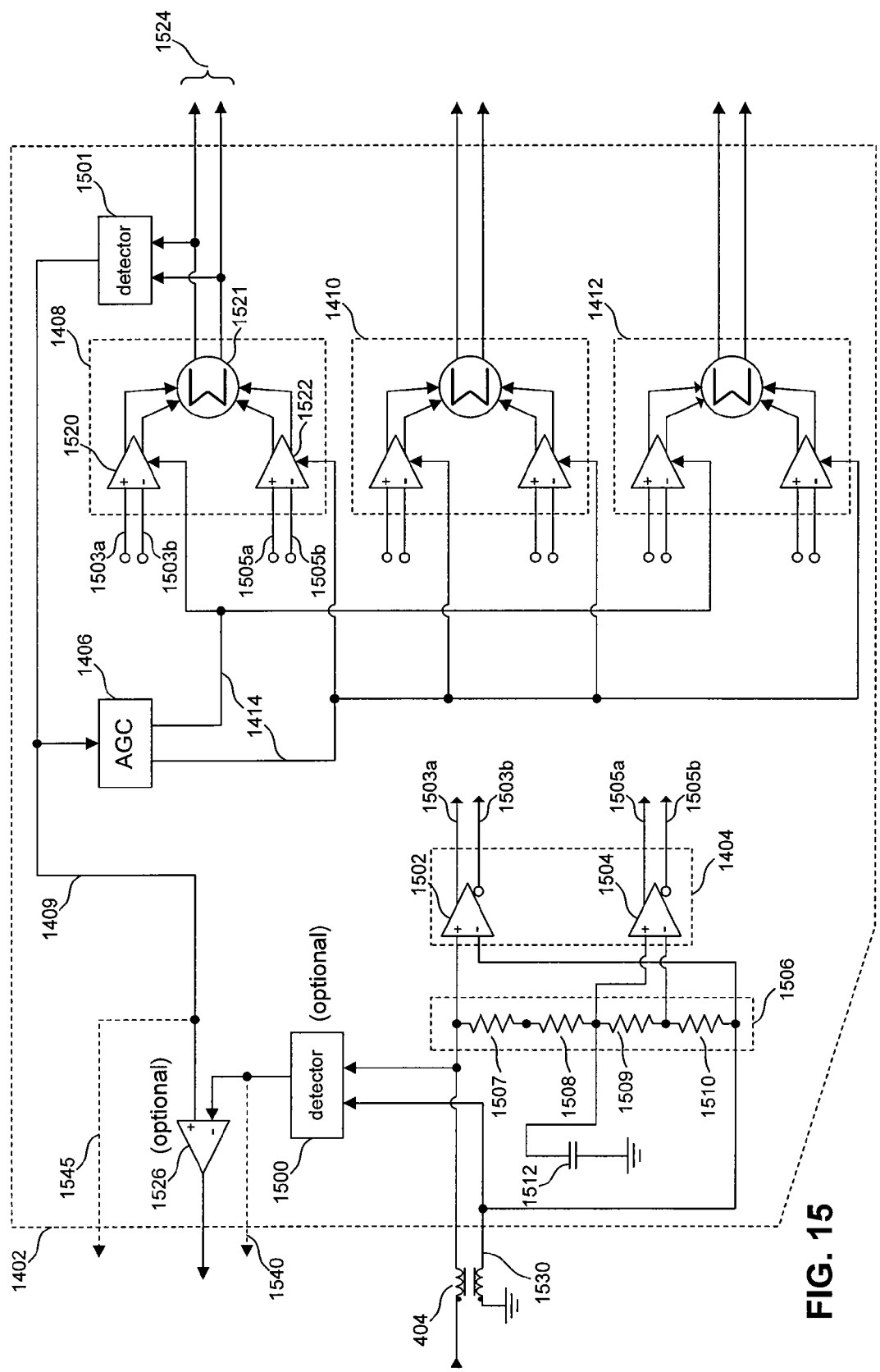
FIG. 15 is a more detailed illustration of the alternative embodiment shown in FIG. 14.

An AGC feedback path 1409 is provided to monitor an output of one of the second stage devices 1408, 1410, and 1412. An AGC loop 1414 is also provided to facilitate the AGC adjustments to all of the second stage devices 1408, 1410, and 1412 based upon the monitoring of the one device, which is depicted as the device 1408 in FIG. 14. Alternatively, an output of the AGC mechanism 1406 could also be fed to the first stage device 1404 to provide AGC adjustments thereto. Finally, a demodulator 1416, functionally similar to the demodulator 4346 of FIG. 43, is provided for demodulation of the input signals. Unlike the demodulator of FIG. 4, however, the demodulator 1416 does not provide any AGC control. FIG. 15 provides a more detailed illustration of the amplification module 1402.

In FIG. 15 the amplification module 1402 includes power detector circuits 1500 (optional) and 1501 for monitoring power levels of the amplification module 1402. Although both of the detector circuits 1500 and 1501 are shown in the exemplary embodiment of FIG. 15, adequate power level monitoring can be achieved by using only one of the detectors. The first stage device 1404 of the amplification module 1402 includes differential amplifier 1502 having respective non-inverting and inverting output ports 1503A and 1503B and an amplifier 1504 having non-inverting and inverting output ports 1505A and 1505B, respectively. The amplification module 1404 via the amplifiers 1502 and 1504 provides a first stage of amplification for the amplification module 1402, wherein the differential amplifier 1502 is used as a high gain amplifier and the differential amplifier 1504 is used as a low gain amplifier.

The high gain amplifier 1502 receives an unattenuated input signal directly from the off-chip balun 404. The amplifier 1504 receives the same input signal. However, the input signal to the amplifier 1504 is attenuated by a differential ladder 1506, which includes impedance devices 1507-1510. Although, in the exemplary embodiment of FIG. 15, the impedance devices 1507-1510 are shown to be resistors, any suitable impedance device can be used. The differential ladder 1506 reduces the gain contribution of the first stage amplifier 1504. A capacitor 1512 provides a differential ac path to ground to maintain differential balance between the differential amplifiers 1502 and 1504.

Also included in the amplification module 1402 are the second stage amplification modules 1408, 1410, and 1412. Each of the second stage modules 1408, 1410, and 1412 includes two differential amplifiers 1520 and 1522 which form a second amplification stage. The amplifiers 1520 and 1522 are configured to have their outputs summed by a summing device 1521 which could be, for example, a wired-OR device. In the present invention, the amplifiers 1520 and 1522 are VGAs, although any suitable amplifier can be used. Additionally, as in the case of the system 400 discussed above with reference to FIG. 4, three second stage amplification modules are used in the present invention, although any suitable number of amplification modules can be used.

Each of the second stage 1520 of the modules 1408, 1410, and 1412 is driven by the high gain amplifier 1502 of the first stage device 1404.

Similarly, each of the second stage amplifiers 1522 is driven by the low gain amplifier 1504 of the first stage device 1404. The gain of the second stage amplifiers 1520 and 1522 can be independently controlled, and the amplifiers are used to selectively combine signals output from the amplifiers 1502 and 1504. In other words, the second stage amplifiers 1520 and 1522 can be used to switch in or out the first stage amplifiers 1502 and 1504. This feature provides the amplification module 1402 with the ability to vary its gain smoothly without effecting its overall linearity.

Maximum gain in the amplification module 1402 is achieved when the amplifier 1520 is set to a maximum gain value and the amplifier 1522 is set to a minimum gain value. It should be noted that the minimum gain setting of the amplifiers 1520 and 1522 is actually a large negative gain, or in other words, a large amount of signal attenuation such that the amplifiers 1520 and 1522 become electrically insignificant to operation of the amplification module 1402. The gain of the amplification module 1402 is decreased by reducing the gain of the amplifier 1520 while increasing the gain of the amplifier 1522. This process continues until the amplifier 1520 has reached a minimum gain value and the amplifier 1522 has achieved its maximum gain value. After the amplifier 1520 has reached its minimum gain value, then the amplifier 1502 of the amplification module 1404 can be deactivated to keep the input devices of the amplifier 1502 from further distorting the input signal.

The gain of the amplification module 1402 can then be further attenuated by reducing the gain of the amplifier 1522. The minimum gain setting of the amplifier 1522 is limited to a finite programmable level when the amplifier 1520 is set to its minimum gain. If the amplifier 1522 was allowed to reach its minimum gain value, then no signal would pass through to downstage tuners. This process is described more fully in the descriptions of FIGS. 5A-8B above.

The amount of attenuation provided by the differential ladder 1506 is fundamentally important and determines a takeover point at which the amplifier 1502 is deactivated or switched out of the signal chain by the amplifier 1520. The selection of this takeover point balances the linearity requirements of the amplifier 1502 with that of the amplifier 1504. Therefore, the attenuation of the differential ladder 1506 and the gain of the amplifier 1504 should be flexible in order to meet different tuner and application performance requirements.

As described above, the active power detector circuits 1500 and 1501 are used to monitor the power level at an input 1530 of the amplification module 1402 and at its outputs 1524, respectively. By providing at least two power detectors 1500 and 1501, the non-linearities of a single power detector can be removed from the system. The removal of the non-linearities facilitates a more accurate gain determination from the inputs to the outputs of the module 1402.

Next, an optional differential amplifier 1526 is configured to subtract the output power level from the input power level to produce a gain control signal that is proportional to the gain of the amplification module 1402 if the power detector circuits 1500 and 1501 are linear in decibels. The gain control signal can be used elsewhere in the system 1400 to enable the system, for example, to comply with data over cable system interface specification (DOCSIS 1.1) signal level detection requirements. The power detector 1501 can also be used to sense the output power level in order to drive an AGC loop created along a path of connection leads 1409 and 1414, which are also shown in FIG. 14. Alternatively, outputs of the detectors 1500 and 1501 can be sensed separately as indicated by optional respective connection leads 1540 and 1545.

Moreover, the power detector 1501, in sensing the output level and driving the AGC loop, is able to maintain the output of the amplification module 1402 at a level that maximizes the signal to noise plus distortion ratio of all of the associated output signals. An optimum output level is the largest possible signal level that does not cause the downstage tuners to violate the system's distortion requirements. In the present invention, this output signal level is programmable in order to provide system flexibility and compatibility with a wide range of associated components, such as tuners.

FIG. 16 is a schematic diagram of an exemplary circuit 1600 representative of the circuit architecture of the amplifiers 1502 and 1504 shown in FIG. 15. However, the size of the devices used in the circuit 1600 can vary in order to maximize the dynamic range of the first stage device 1404. The circuit is a source coupled differential transistor pair amplifier formed by active devices 1601 and 1602 along with an off-chip RF choke 1614. The RF choke 1614 is used as a tail for the common source of the devices 1601 and 1602 and is a differential transistor pair tail with a large AC impedance. The large AC impedance helps second-order distortion performance and suppresses common-mode input signals without wasting DC voltage headroom.

Next, devices 1606a and 1608a provide an active nonlinear load to maximize headroom. The nonlinearity of the diode I-V curve is the same as the differential amplifier formed by the device 1601 and 1602, thus making the differential output voltage very linear. If the diodes 1606a and 1608a are made the same size devices as in the differential pair devices 1601 and 1602 and the current is the same, the gain would be unity. This would not result in a very useful amplifier since the noise figures would not be too high.

If some of the DC current is shunted away from the diodes 1606a and 1608a, the gain will be greater. Since an ideal current source has infinite impedance, no gain reduction results. This is shown in FIG. 16A using the current sources 1610a and 1612a.

Figure 16A:
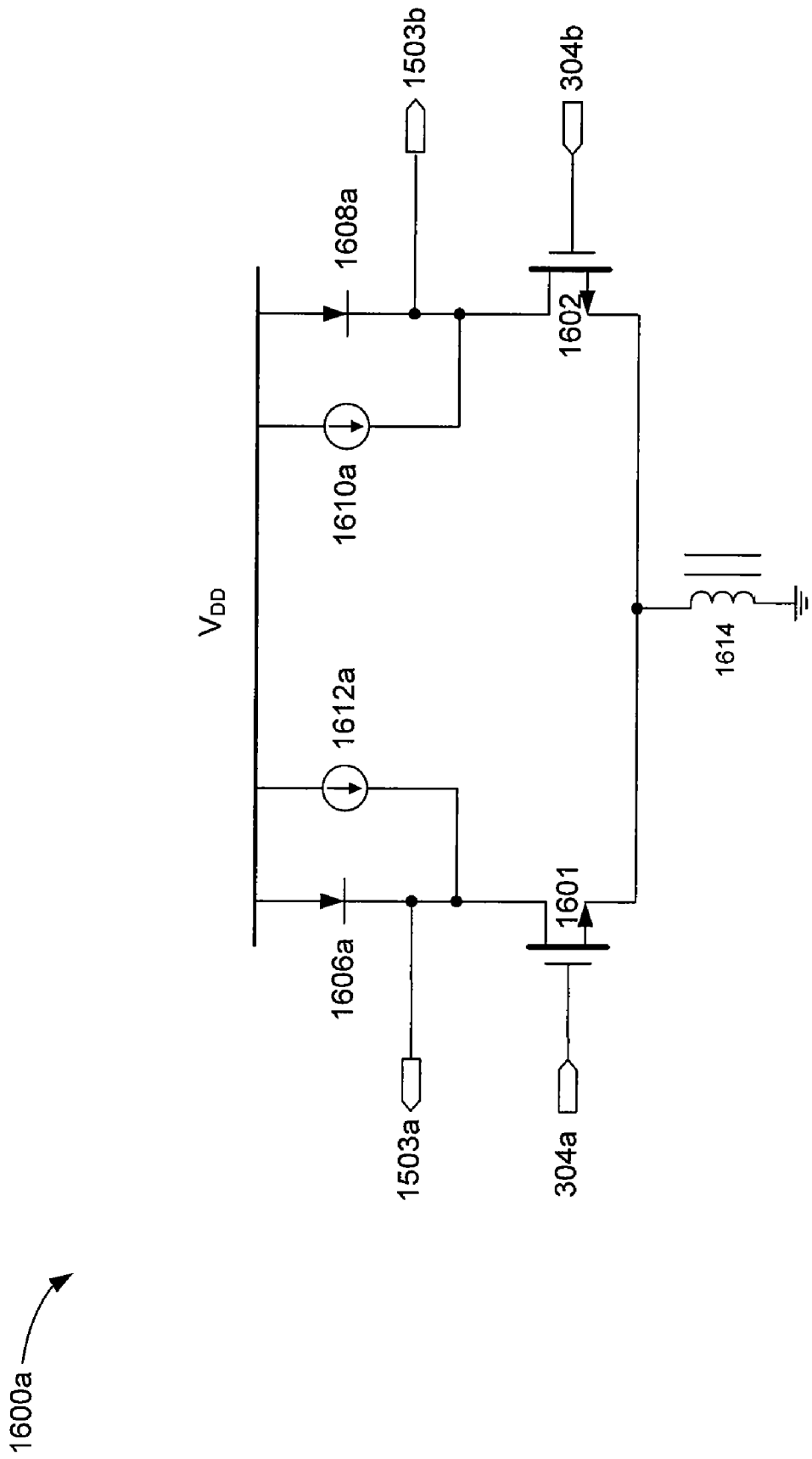
FIG. 16A is a simplified exemplary schematic diagram of the first stage amplifiers in the illustration shown in FIG. 15.
Figure 16B:
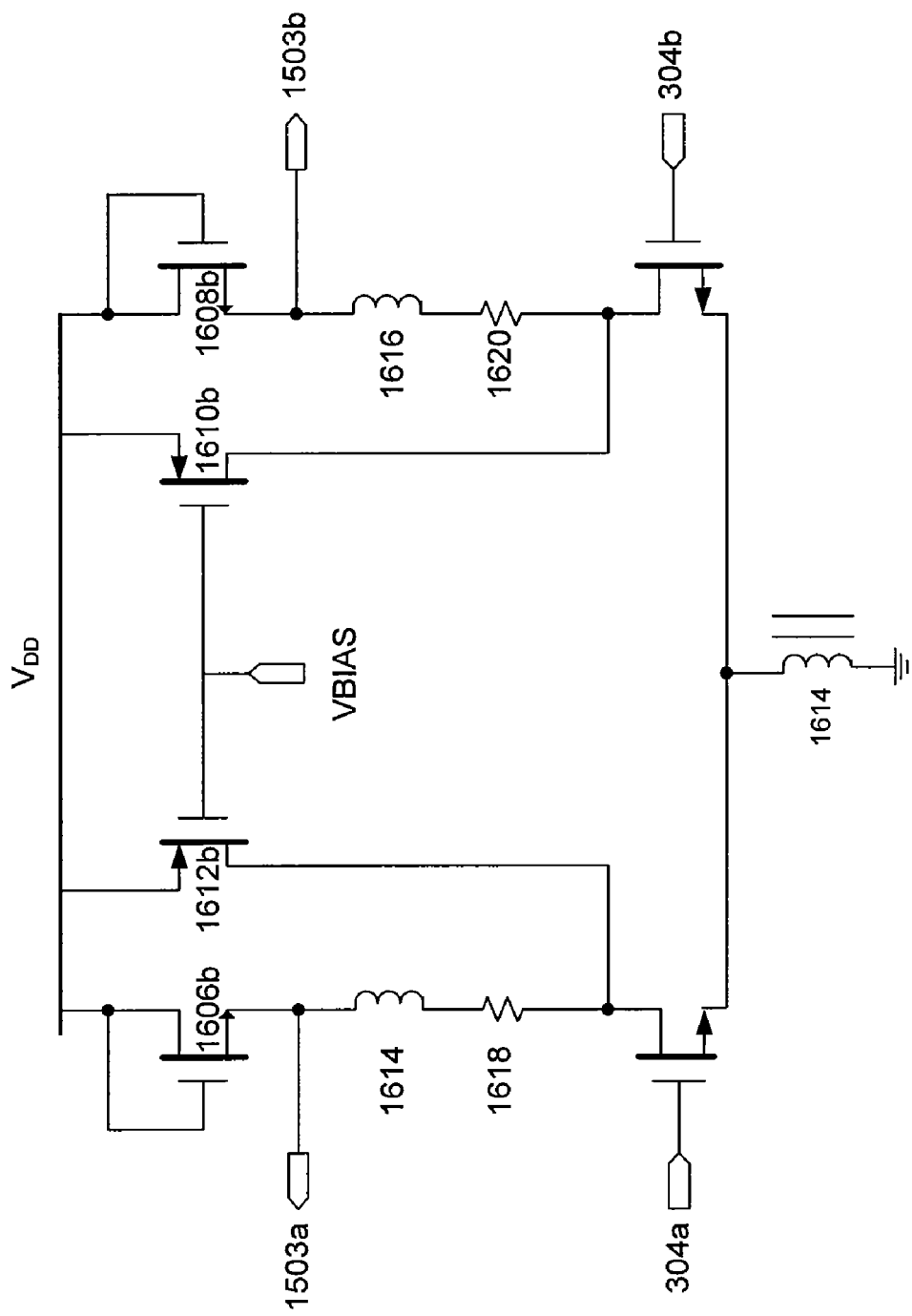
FIG. 16B is a more detailed version of the illustration of FIG. 16A.

FIG. 16B is a more detailed illustration of the circuit 1600a shown in FIG. 16A. In FIG. 16B, N-channel metal oxide semiconductor (N-MOS) transistors 1606b and 1608b respectively form the diodes 1606a and 1608a. The transistors 1610b and 1612b form P-channel metal oxide semiconductors (P-MOS) current sources that are respectively representative of the current sources 1610a and 1612a. Because of consideration for process variations, the transistors 1606b and 1608b were chosen as N-MOS devices, matching the device types of the transistors 1601 and 1602. The transistors 1606b and 1608b, however, could have also have been P-MOS devices.

Peaking inductors 1614 and 1616 are used to achieve better bandwidth from the two output ports 1503a and 1503b. Most on-chip inductors also include a fair amount of series resistance, which is represented by the resistors 1618 and 1620. The configuration of both diodes and resistors creates a hybrid between a pure diode load and a pure resistive load. A pure resistive load would provide significant gain but would not be as linear as a pure diode load. With the hybrid approach, the present invention provides an increase in both linearity and gain.

Additionally, active devices 1610a and 1612b are used to shunt a predetermined amount of current from the devices 1606a and 1608b in order to reduce a voltage drop and increase the voltage headroom of the devices 1601 and 1602, thus also increasing their linearity. While FIGS. 16A and 16B provide exemplary versions of architecture used in the first stage amplifiers 1502 and 1504, FIG. 17 provides a circuit 1700 representative of exemplary architecture of the second stage amplifiers 1520 and 1522.

Figure 17:
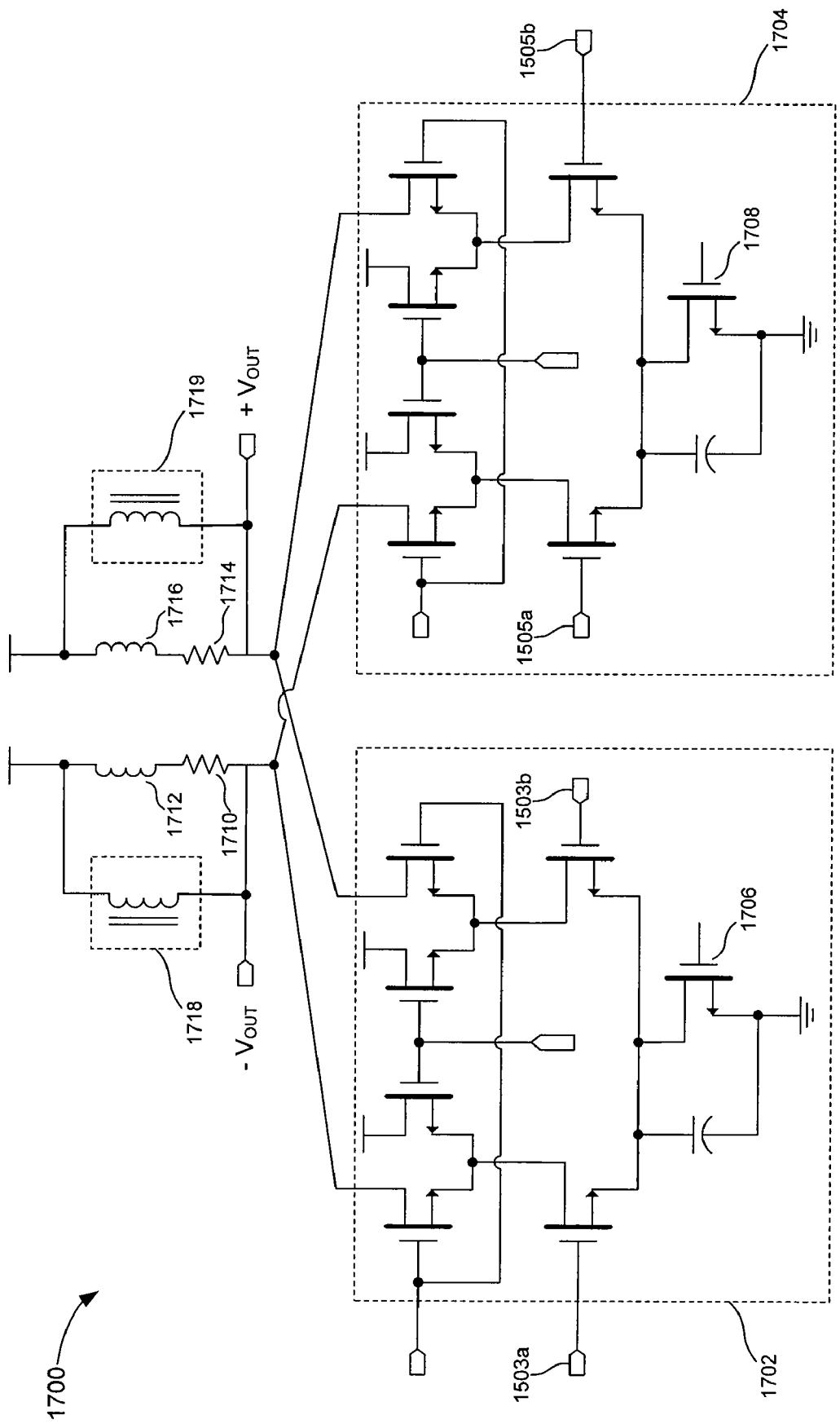
FIG. 17 is an exemplary schematic diagram of the second stage amplifiers used in the illustration of FIG. 15.

As illustrated in FIG. 17, the second stage device 1408 includes two current steering circuits 1702 and 1704, which are summed together in a wired OR implementation. The function of the two current steering circuits 1702 and 1704 is substantially similar to the current steering arrangement described in relation to FIG. 9.

One difference, however, between the arrangements shown in FIGS. 9 and 17 is that the current steering circuits 1702 and 1704 are biased with current sources 1706 and 1708 respectively. The input to current steering circuit 1702 is the signal produced at the outputs 1503A and 1503B of the unattenuated amplifier 1502 shown in FIG. 15. The input to the current steering amplifier 1704 is the signal produced at the output 1505A and 1505B of the attenuated amplifier 1504 shown in FIG. 15.

The on-chip load of output ports −Vout and +Vout are respective series resistor inductor shunt peaking combination 1710/1712 and 1714/1716 that are used to extend the broadband bandwidth. While the inductors 1614 and 1616 of FIG. 16 are used in a series peaking arrangement, it is pointed out that in the exemplary embodiment of FIG. 17 the series resistor inductor 1710/1712 and 1714/1716 are placed in parallel with the parasitic capacitance. Additionally, inductors 1718 and 1719 are off-chip RF chokes used to reduce the DC voltage drop across the shunt peaking combinations 1710/1712 and 1714/1716, respectively.

A key advantage to the autonomous AGC control technique of the present invention is that autonomous AGC sets an optimum level of input for an amplification stage for best noise figure and distortion performance. Further, autonomous AGC, as implemented in the present invention, provides AGC for all channels of the entire spectrum of the cable modem simultaneously. If the current source of a standard coupled pair is used to vary the gain, the linearity degrades substantially as the gain is reduced. This might be, for example, because the gain is proportional to the transconductance while the linearity is proportional to the DC bias current. The transconductance varies with the square root of the bias current in a metal oxide semiconductor device. As the current is decreased, the linearity reduces substantially faster than the gain so that a highly distorted signal can be passed with a significant amount of power gain. However, differential pairs can be implemented in two stacked devices and consume minimal voltage headroom and have a large linear range when the current is not varied.

Alternatively, current steering circuits vary gain by switching the current from the load to the voltage supply. In this case, the linearity is always constant for the input device but the gain can now be varied. The problem is that a first stage current steering circuit would stack at least three device and use more voltage headroom than a differential pair and will have an inferior second order linearity performance.

The architecture of the present invention blends the advantages of the high second order linearity differential pair in the first stage and the constant linearity with varying gain ability of the current steering circuit in the second stage.

CONCLUSION

The present invention provides an active splitter arrangement in the place of traditional splitter arrangements that can be used in devices such as cable set-top boxes, cable televisions, and/or cable modem applications. By using the active splitter arrangement of the present invention, the full use of the input signal ranges can be achieved and the associated amplification stages can provide better linearity and gain performance characteristics.

The present invention also provides the active splitter arrangement and its associated LNA function on a single IC to provide low noise amplification and automatic gain control with minimal system degradation. Alternatively, this also includes discrete implementations of the active splitter function, i.e., the non IC active splitters. Additionally, the present invention can be implemented using a variety of substrate technologies, to include CMOS. The LNA function of each downstage tuner is incorporated in a single low noise broadband VGA that provides nearly identical performance to single tuners at a lower costs than conventional passive splitter solutions.

Finally, the present invention also provides an improved circuit architecture that can vary the gain of low noise VGAs without degrading their linearity performance. The improved architecture blends the advantages of the fixed gain high second order linearity differential pair in a first stage and the highly linear varying gain ability of a current steering circuit in a second stage.

The foregoing description of the preferred embodiments provide an illustration and description, but is not intended to be exhaustive or to limit the invention to the precise form disclosed. Modifications and variations are possible consistent with the above teachings or may be acquired from practice of the invention. Thus, it is noted that the scope of the invention is defined by the claims and their equivalents.

What is claimed is:

1. An amplifier comprising:
a first amplification module having a number of first input ports and first output ports, the first amplification module being configured to (i) provide first stage amplification to a received input signal and (ii) produce from the amplified input signal a number of output signals, each having characteristics substantially matching characteristics of the input signal;
a first gain control device having a number of gain input ports respectively coupled to the first output ports and a gain output port coupled to at least one of the first input ports, the first gain control device being configured to control a gain of the first amplification module; and
a number of second amplification modules, each having a number of second input ports respectively coupled to the first output ports;
wherein each second amplification module is configured to (i) receive a control signal from a second gain control device, (ii) provide second stage amplification to a corresponding one of the number of output signals based upon the control signal and (iii) produce an amplified output signal.

2. The amplifier of claim 1, wherein each amplified output signal is a differential signal.

3. The amplifier of claim 2, wherein the first amplification module is a low noise amplifier.

4. The amplifier of claim 2, wherein the first amplification module is a low noise variable gain amplifier.

5. The amplifier of claim 2, wherein the first gain control device simultaneously controls a gain of all of the number of second amplification modules.

6. The amplifier of claim 2, wherein the number of output signals is representative of a predetermined frequency spectrum; and
wherein the first gain control device simultaneously controls a gain across the predetermined frequency spectrum.

7. The amplifier of claim 2, wherein a gain of the first amplification module is digitally controlled.

8. The amplifier of claim 2, wherein the first amplification module comprises:
a power detector configured to (i) monitor the first output ports, (ii) produce a compensating signal based upon the monitoring, and (iii) provide the compensating signal as an input to the first amplification module.

9. The amplifier of claim 1, further comprising:
a tuner coupled to each of the second stage amplification modules and configured to receive the amplified output signal;
wherein the tuner derives information from the amplified output signal based upon a predetermined operating frequency, the tuner producing a tuned signal thereby; and
a demodulator coupled to the tuner and configured to demodulate the tuned signal, the demodulator (i) producing a gain control signal and (ii) providing the gain control signal to the second gain control device.

10. The amplifier of claim 9, wherein the first and second amplification modules are differential amplifiers.

11. The amplifier of claim 9, wherein the tuner comprises:
a variable gain amplifier.

12. The amplifier of claim 9, wherein the tuner comprises:
a number of mixers and at least one filter.

13. The amplifier of claim 12, wherein the filter is configured to have a bandwidth comprising:
five or fewer channels.

14. The amplifier of claim 12, wherein the first amplification module comprises:
a pair of plural differential amplifiers and a dividing network.

15. The amplifier of claim 14, wherein a gain of the first amplification module is controlled by selectively activating or deactivating particular ones of the plural differential amplifiers of the pair.

16. The amplifier of claim 14, wherein the filter is configured to have a bandwidth comprising:
five or fewer channels.

* * * * *